United States Patent
Guo et al.

(10) Patent No.: US 11,183,814 B2
(45) Date of Patent: Nov. 23, 2021

(54) SURFACE-EMMITING LASER COMPRISING SURFACE GRATINGS

(71) Applicants: Huazhong University of Science and Technology, Wuhan (CN); Weihua Guo, Wuhan (CN)

(72) Inventors: Weihua Guo, Wuhan (CN); Can Liu, Wuhan (CN); Pengfei Zhang, Wuhan (CN); Qiaoyin Lu, Wuhan (CN)

(73) Assignees: HUAZHONG UNIVERSITY OF SCIENCE AND TECHNOLOGY, Wuhan (CN); Weihua Guo, Wuhan (CN)

( * ) Notice: Subject to any disclaimer, the term of this patent is extended or adjusted under 35 U.S.C. 154(b) by 193 days.

(21) Appl. No.: 16/729,322

(22) Filed: Dec. 28, 2019

(65) Prior Publication Data
US 2021/0013699 A1 Jan. 14, 2021

(30) Foreign Application Priority Data

Jul. 9, 2019 (CN) .......................... 201910619098.1

(51) Int. Cl.
| | |
|---|---|
| *H01S 5/00* | (2006.01) |
| *H01S 5/187* | (2006.01) |
| *H01S 5/042* | (2006.01) |
| *H01S 5/22* | (2006.01) |
| *H01S 5/12* | (2021.01) |
| *H01S 5/34* | (2006.01) |
| *H01S 5/183* | (2006.01) |
| *H01S 5/30* | (2006.01) |

(52) U.S. Cl.
CPC .......... *H01S 5/187* (2013.01); *H01S 5/04256* (2019.08); *H01S 5/1215* (2013.01); *H01S 5/1237* (2013.01); *H01S 5/22* (2013.01); *H01S 5/2205* (2013.01); *H01S 5/34* (2013.01); *H01S 5/124* (2013.01); *H01S 5/183* (2013.01); *H01S 5/3095* (2013.01)

(58) Field of Classification Search
CPC ........ H01S 5/183; H01S 5/04256; H01S 5/22; H01S 5/1237; H01S 5/1215; H01S 5/187; H01S 5/2205; H01S 5/34; H01S 5/124; H01S 5/3095
See application file for complete search history.

(56) References Cited

U.S. PATENT DOCUMENTS

| | | | |
|---|---|---|---|
| 6,411,640 B1 * | 6/2002 | Nakanishi | H01S 5/06258 372/96 |
| 2006/0187989 A1 * | 8/2006 | Tanaka | H01S 5/22 372/45.01 |
| 2019/0319426 A1 * | 10/2019 | Lu | H01S 5/1206 |

* cited by examiner

*Primary Examiner* — Kinam Park
(74) *Attorney, Agent, or Firm* — Matthias Scholl P.C.; Matthias Scholl

(57) ABSTRACT

A surface-emitting laser, which is a ridge waveguide structure, including: a substrate, a first cladding layer, an active layer, a conductive layer, a second cladding layer; the Bragg gratings is etched on the surface of the ridge waveguide; the two upper electrodes are disposed on both sides of the ridge waveguide; two grooves are formed between the ridge waveguide and each of the two upper electrodes; the first waveguide cladding layer includes one or more current confinement regions; or a buried tunnel junction is formed in the second cladding layer for limiting current. The Bragg gratings comprise two first-order gratings and one second-order grating placed between two first-order gratings.

8 Claims, 33 Drawing Sheets

SURFACE-EMMITING LASER COMPRISING SURFACE GRATINGS

CROSS-REFERENCE TO RELATED APPLICATIONS

Pursuant to 35 U.S.C. § 119 and the Paris Convention Treaty, this application claims foreign priority to Chinese Patent Application No. 201910619098.1 filed Jul. 9, 2019, the contents of which, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND

The disclosure relates to the field of semiconductor lasers, and more particularly to a surface-emitting laser comprising surface gratings.

The vertical-cavity surface-emitting laser (VCSEL) is a type of semiconductor laser with laser beam emission perpendicular from the top surface, and has the disadvantages of relatively low modulation bandwidth and uncontrollable lasing wavelength.

The horizontal-cavity surface-emitting laser has the disadvantages of relatively high threshold current and power consumption.

SUMMARY

The disclosure provides a surface-emitting laser. The cross section of the laser comprising a substrate; two lower electrodes; a first cladding layer; an active layer; a conductive layer; a second cladding layer; and two upper electrodes.

The second cladding layer comprises a ridge waveguide region; and the surface of ridge waveguide comprises a plurality of Bragg gratings; the two upper electrodes are disposed on both sides of the ridge waveguide, respectively; and the two lower electrodes are disposed outside the two upper electrodes, respectively; two grooves are formed between the ridge waveguide and each of the two upper electrodes, respectively; the active layer is disposed on the first cladding layer; and the conductive layer is disposed on the active layer; the conductive layer is electrically connected to the two upper electrodes; and the first cladding layer or the second cladding layer comprises a resistive region for limiting current injection.

The plurality of Bragg gratings comprises one second-order grating and two first-order gratings; a period of the Bragg gratings is $\Lambda = m\lambda_B/2n_{eff}$, where $\lambda_B$ and m are a wavelength and an order of the Bragg gratings, respectively; m=1 represents a first-order grating, and m=2 represents a second-order grating; and $n_{eff}$ is an effective refractive index of a waveguide; the one second-order grating is disposed in a central region of a longitudinal direction of the laser, providing a $\lambda/4$ phase shift and vertical scattering of light; and the two first-order gratings are disposed on both sides of the one second-order grating, providing optical feedback and wavelength selection.

The two grooves extend to the conductive layer, and a width of the two grooves is greater than 500 nanometers.

The resistive region is disposed in the first cladding layer close to the active layer or in the second cladding layer close to the active layer.

The resistive region comprises a pre-buried high aluminum component layer to form an oxidized layer, or an iron implanted layer, or a reverse PN junction.

The active layer comprises an active semiconductor layer and one or more confinement layers; and the active semiconductor layer consists of multi-quantum wells, quantum dots or bulk material.

The current starts from the two lower electrodes, and flows into the active layer under the ridge waveguide via a window formed by the resistive region, and then moves laterally from the conductive layer into the two upper electrodes.

The second-order grating can provide a $\lambda/4$ phase shift, to select an emitting mode corresponding to Bragg wavelength as a lasing mode of the laser.

The second-order grating region can diffract the optical field, to vertically emit an emitting mode corresponding to the Bragg wavelength to realize the surface emission of the laser.

The coupling coefficient of the gratings can be increased by increasing the depth of the etched grating and the material refractive index of the second cladding layer, and decreasing the thickness of the ridge waveguide layer; on the contrary, the coupling coefficient is reduced.

The laser can output around spot by adjusting the length of the second-order grating region and the width of the corresponding ridge waveguide.

The first cladding layer comprises a distributed Bragg reflector (DBR) to increase the light-emitting efficiency in the vertical direction, and the output optical power can be changed by adjusting the distance between the active layer and DBR; or a DBR comprising a metal or dielectric is disposed on the second-order grating to increase the light-emitting efficiency, so that the light emits from the substrate of the laser in the vertical direction, and the output optical power can be changed by adjusting the distance between the active layer and the DBR.

Advantages of the surface-emitting laser according to embodiments of the disclosure are summarized as follows: the surface of the ridge waveguide comprises a second-order grating and two first-order gratings. The second-order grating is disposed between the two first-order gratings, and the second-order grating can provide a $\lambda/4$ phase shift, realizing the vertical scattering of the light. The two first-order gratings are configured for the optical feedback and emitting mode selection. The surface of the ridge waveguide is provided with no electrodes, and the upper electrodes are disposed on both sides of the ridge waveguide. This saves the power consumption and simplifies the manufacture of the electrodes.

DETAILED DESCRIPTION

To further illustrate, embodiments detailing a surface-emitting laser are described below. It should be noted that the following embodiments are intended to describe and not to limit the disclosure.

Figure 1:
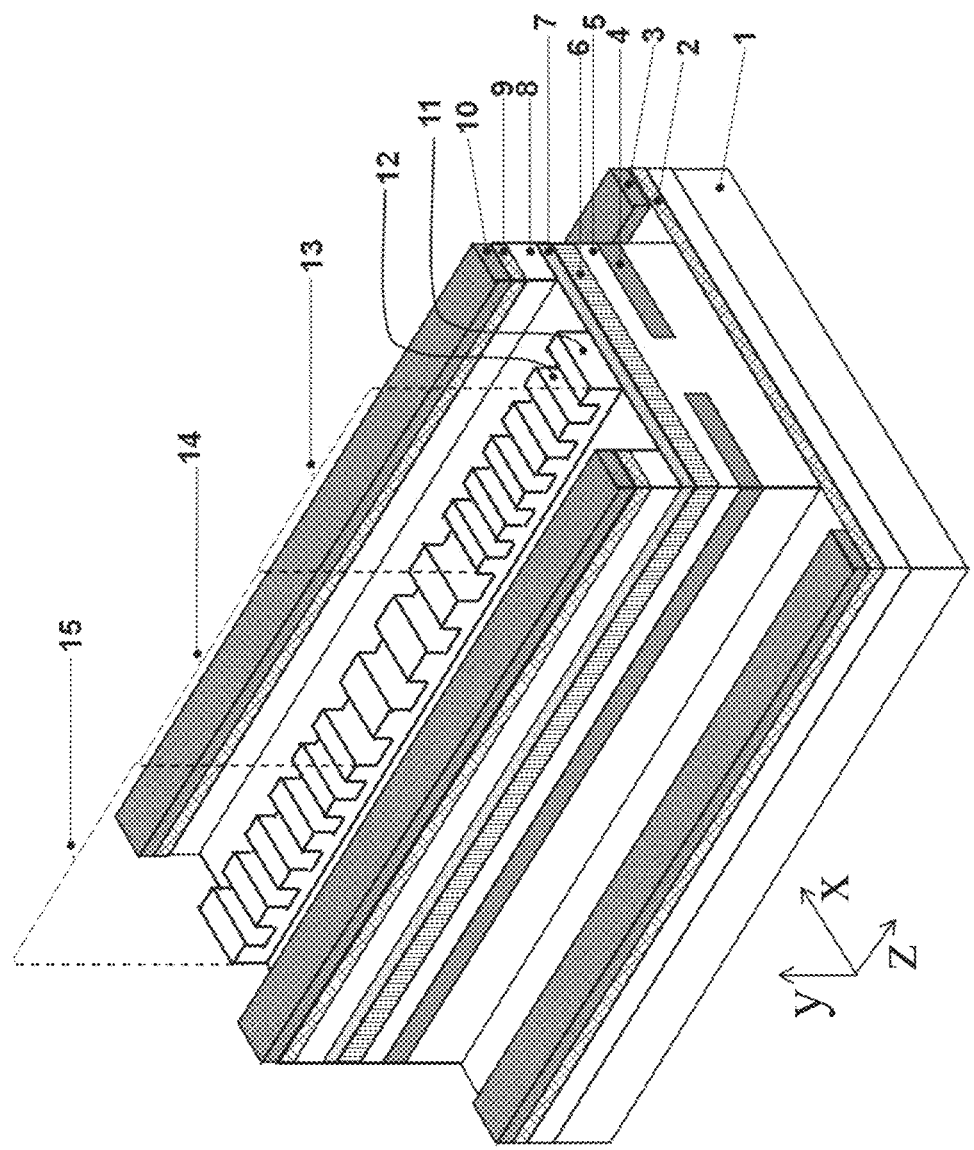
FIG. 1 is a schematic diagram of a laser according to one embodiment of the disclosure.

FIG. 1 is a schematic diagram of a surface-emitting laser. The vertical, lateral, and longitudinal directions of the laser are labeled as x, y, and z, respectively, where the z is the direction of propagation of the light field, and all the schematic diagrams in the disclosure are labeled with the same spatial coordinate system. As shown in FIG. 1, the semiconductor laser comprises a substrate 1, a first ohmic contact layer 2, two lower electrodes 3, a resistive region 4, a first cladding layer 5, an active layer 6, a conductive layer 7, a second cladding layer 8, a second ohmic contact layer 9, and two upper electrodes 10. The first cladding layer 5 is p-doped or n-doped; the active layer 6 is not doped; the conductive layer 7 is n-doped; the second cladding layer 8 is n-doped; the second cladding layer 8, the active layer 6 and the first cladding layer 5 together form an N-i-P structure. The N-P-i-N structure is formed when tunnel junctions are inserted between the second cladding layer 8 and the active layer 6. The first ohmic contact layer 2 is included in the first cladding layer 5 and is the heavily p-doped or n-doped material with a doping concentration of $10^{18}$ to $10^{19}$ cm$^{-3}$, functioning as an ohmic electrical contact layer. The first cladding layer 5 also comprises one or more layers of resistive regions 4, such resistive regions are used to restrict the injection region of current. The similar resistive regions can also be implemented by introducing a reverse PN junction between the second cladding layer 8 and the active layer 6. The active layer 6 is used to provide optical gain, and the active layer 6 comprises one or more quantum wells and one or more light confinement layers. Quantum wells can also be replaced by bulk materials, quantum wires, or quantum dots. A ridge waveguide 11 is formed on the second cladding layer 8, and a grating 12 is etched on the ridge waveguide 11. A second-order grating 14 for coupling out light is inserted between the two first-order gratings 13, 15 that provide optical feedback for the laser.

As shown in FIG. 1, the resistive region 4 is formed in the position close to the active layer 6 in the first cladding layer 5. The resistive region can ensure that the carriers only inject into the active layer from directly under the ridge waveguide, so the injection region of such carriers and the mode of the ridge waveguide can be maximally overlapped, improving the injection efficiency of the laser. The introduction of the resistive region can effectively reduce the volume of the carrier injection region, thus achieving low threshold lasing. The second cladding layer is relatively thin, the second cladding layer is preferably doped with N-type to facilitate horizontal injection of current, due to the reason that electrons have much higher mobility than holes.

The resistive region 4 is formed by pre-burying an aluminum-rich layer such as an AlAs layer in a corresponding region, and then oxidizing the aluminum-rich layer from both sides to form aluminum oxide. It is also possible to form by implanting ions into a corresponding region. Alternatively, a reverse PN junction can be introduced above the active region to form a resistive region, and the PN junction directly under the ridge waveguide is used to form a path for current injection. The specific operation is as follows: a light p-doped layer is introduced between a high-conductive n-doped layer and an active layer, and a tunnel junction is introduced under the ridge waveguide. Under such circumstances, the first cladding layer can be n-doped, and the structure become $N-N^{++}-P^{++}-i-N$ in the tunnel junction region, where $N^{++}-P^{++}$ is a tunnel junction. The area outside the tunnel junction is an N-P-i-N structure. When the upper N electrode is applied with a positive bias voltage, the area outside the tunnel junction cannot be injected with current due to the reverse biased NP junction. At the location of the tunnel junction, the electrons can pass through the tunnel junction from the $P^{++}$ layer into the $N^{++}$ layer via quantum tunneling so that holes can be injected into the active layer below the tunnel junction.

Figure 2A:
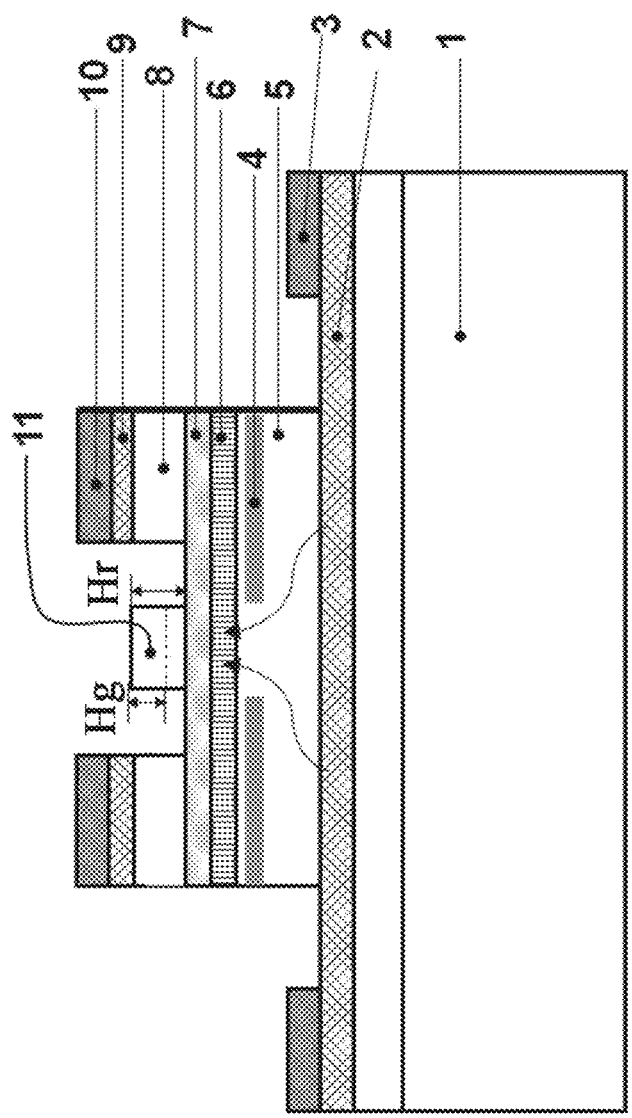
FIG. 2A is a cross-sectional view of a laser comprising an aluminum-rich current confinement layer according to one embodiment of the disclosure.
Figure 2B:
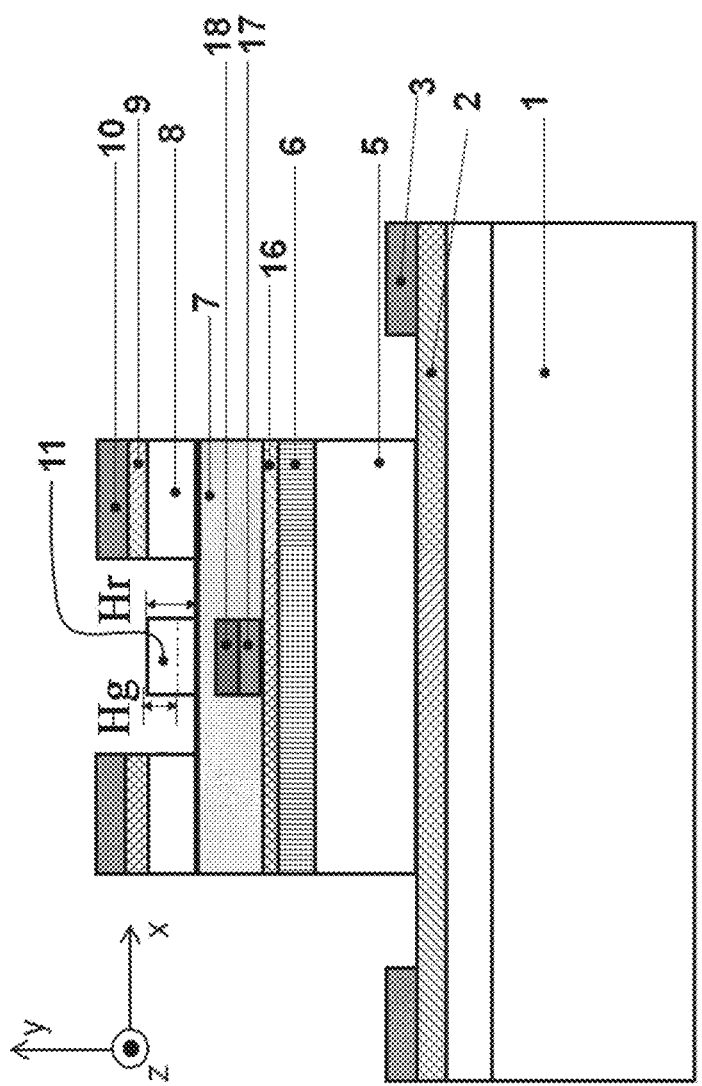
FIG. 2B is a cross-sectional view of a laser comprising a tunnel junction according to one embodiment of the disclosure.

FIGS. 2A-2B show the cross-sectional structure of the laser (x-y plane): FIG. 2A shows a method of limiting the injection of the current by oxidation of a high aluminum component layer. As shown in FIG. 2A, in the laser, the first cladding layer 5 comprises an aluminum-rich layer 12 adjacent to the active layer 6. The material of the layer containing an aluminum-rich component generally contains 80% or more of the aluminum component and can be oxidized to $(AlGa)_xO_y$, which has an insulating effect, and the layer is oxidized to form the resistive region 4 limiting the injection of the current.

FIG. 2B shows another method of limiting the injection of the current, that is, a buried tunnel junction method. A lightly P-doped layer 16 is grown above the active layer, and a heavily P-doped thin layer 17 and a heavily N-doped thin layer 18 are further grown, and then the heavily P and N-doped thin layer are removed by wet etching, except for the regions 17, 18 below the ridge waveguide, as shown in FIG. 2B. Followed by the growth of a heavily N-doped highly conductive layer 7 and a cladding layer 8. The tunnel junction is composed of a heavily P-doped layer 17 and a heavily N-doped layer 18. When a positive voltage is applied to the second electrode for current injection, the buried tunnel junction allows current to pass, and other regions are not allowed to pass due to the reverse biased PN junction, and hence current is injected into the active layer under the ridge waveguide. The buried tunnel junction thus forms a region where limits the current injection.

As shown in FIGS. 2A-2B, a surface grating having a depth of $H_g$ is etched on the ridge waveguide having an etching depth of $H_r$. The disclosure adopts a surface grating for light feedback and emission. In order to get high feedback, the second cladding layer of the ridge waveguide is required to be as thin as possible. In order to avoid absorption of the light field by the electrodes in the active region, no electrodes are formed on the ridge waveguide. The upper electrodes 10 are disposed on both sides of the ridge waveguide, and the grooves are etched between the ridge waveguide 11 and the upper electrodes 10 on both sides, and extend to the conductive layer 7. The width of the two grooves are greater than 500 nanometers such that the electrode region is remote from the ridge waveguide core region and thus pose no effect on the mode of the ridge waveguide. The second cladding layer 8 forms connection with the upper electrodes 10 on both sides through the ohmic contact layers 9 on both sides. The height $H_r$ of the ridge waveguide and the etching depth $H_g$ of the grating can be determined according to the desired performance of the laser. The deeper the etching depth Hs of the grating, the larger the coupling coefficient, the stronger the feedback of the first-order grating, thus reducing the physical length of the optical device. However, the surface grating is not allowed to etch too deep, or the light confinement of the ridge waveguide will be weakened, causing the leakage of the laser light towards the electrode regions and further affecting the laser performance.

Figure 3:
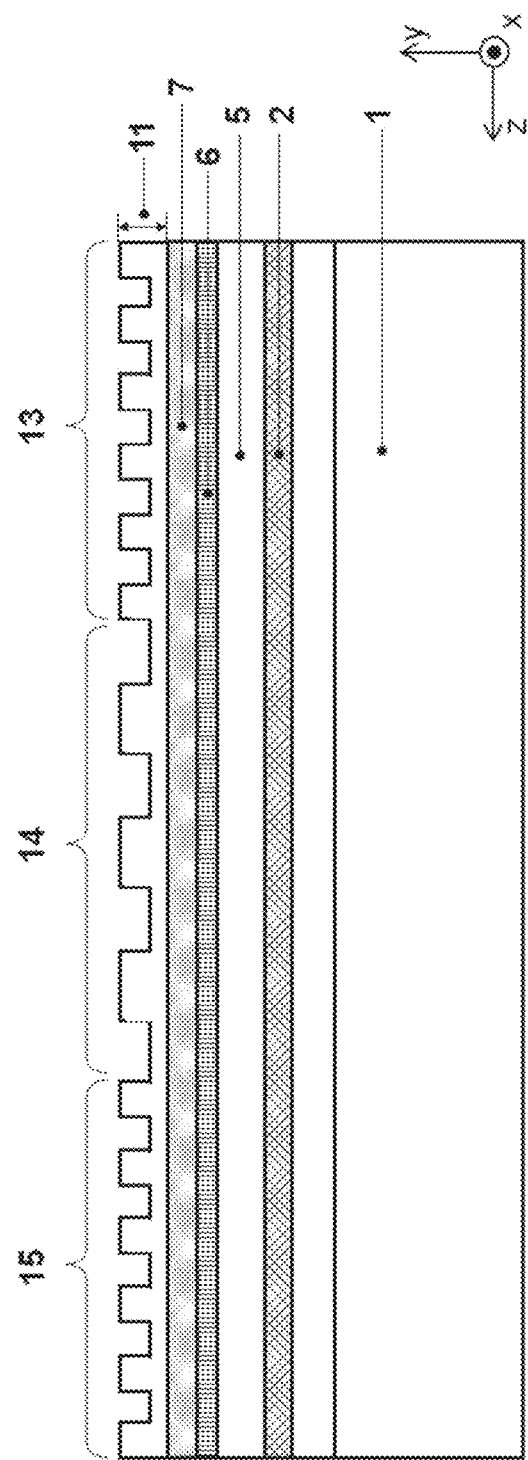
FIG. 3 is a longitudinal section view of a laser according to one embodiment of the disclosure (y-z plane).

FIG. 3 shows the longitudinal structure (y-z plane) of the laser according to one embodiment of the disclosure. As shown in FIG. 3, the gratings 13, 14, 15 are etched on the surface of the ridge waveguide, wherein the gratings 13 and 15 are first-order gratings for providing optical feedback, and the grating 14 is second-order grating for coupling out light. The first-order gratings 13, 15 and the second-order gratings 14 have the same etching depth Hs, and the periods are $\Lambda_1=\lambda_B/2n_{eff}$, $\Lambda_2=\lambda_B/n_{eff}$, respectively, where $\lambda_B$ and $n_{eff}$ are the Bragg wavelengths corresponding to the gratings and the effective refractive index of waveguides, respectively. The first-order gratings 13 and 15 at Bragg wavelength $\lambda_B$ are capable of providing maximum optical feedback. The second-order grating 14 is commonly disposed in the central region of the laser resonant cavity. In addition to serving a purpose of coupling out light, the second-order grating 14 also provides a $\lambda/4$ phase shift, which ensures that the Bragg wavelength of the grating is the resonant wavelength of the laser resonant cavity. At the same time, the diffracted light of the second-order grating 14 is output vertically upward to achieve surface-emitting of the laser. The working principle of the surface-emitting laser according to one embodiment of the disclosure using the first-order Bragg grating to provide optical feedback, the second-order Bragg grating to provide $\lambda/4$ phase shift, and diffract light is specifically described below. For the first-order Bragg gratings 13 and 15, the grating equation satisfies:

$$|\sin \beta \pm \sin \theta|=2m \qquad (1)$$

where $\beta$ is the diffraction angle of the grating, $\theta$ is the angle of incidence, and m is an integer representing the diffraction order. For a horizontal waveguide, its light is transmitted along a horizontal cavity and is incident perpendicularly on the Bragg grating, corresponding to an incident angle $\theta=\pi/2$. This means that m can only be 1 and the corresponding $\beta$ can be two values: $\beta=\pi/2$ and $\beta=-\pi/2$, wherein $\beta=\pi/2$ represents that the light continues to propagate forward along the horizontal cavity, and $\beta=-\pi/2$ represents that the light propagate back in the horizontal cavity, which realize optical feedback.

Figure 4C:
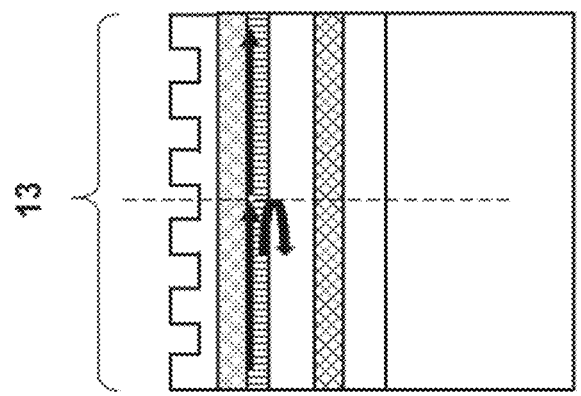
FIGS. 4A-4C show the diffraction of a first-order grating and a second-order grating.
Figure 4B:
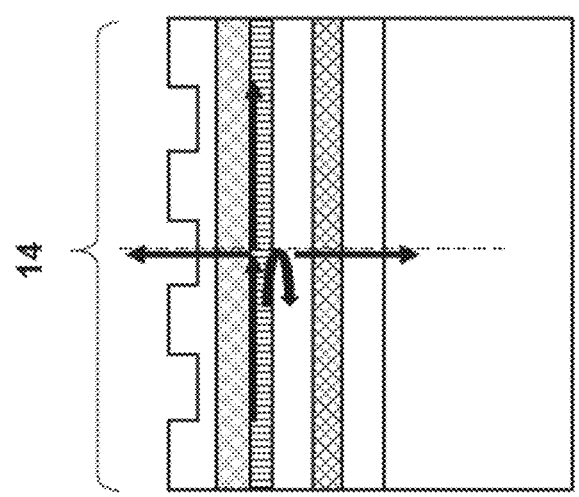
Figure 4A:
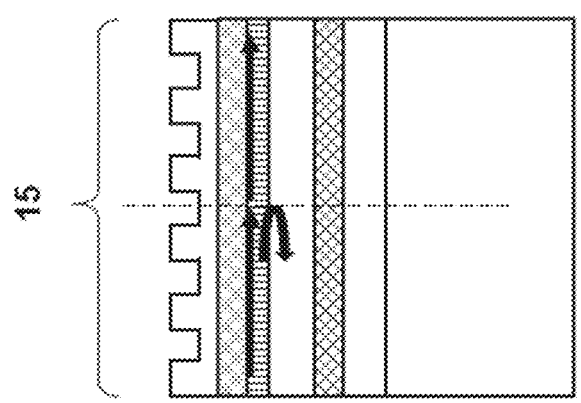

For the second-order Bragg grating 14, the grating equation satisfies:

$$|\sin \beta \pm \sin \theta|=m \qquad (2)$$

where m can be 1 and corresponding $\beta$ can be two values: $\beta=0$, represents that the light propagates upward perpendicular to the horizontal cavity, belonging to the first-order diffraction of the second-order grating and providing the surface emission function of light; $\beta=\pi$, represents that the light propagates downward perpendicular to the horizontal cavity and can be partially converted into upwardly propagating light by making a DBR under the active region; wherein m can also be 2, the value corresponding to β is the same as that of the first-order grating, in other words, it can also provide a function of optical feedback. A typical diffraction schematic of a first-order grating and a second-order grating is shown in FIGS. 4A-4C.

In a distributed feedback laser, the resonant wavelength is:

$$\lambda_0 = \lambda_B \pm \left[\left(q + \frac{1}{2} + \frac{\varphi}{\pi}\right)\frac{\lambda_B^2}{2\tilde{n}L}\right] \quad (3)$$

where $\lambda_B$ is the Bragg wavelength, $\tilde{n}$ is the effective refractive index, L is the length of the laser cavity, q is an integer, φ is the phase change of the traveling wave field caused by the change of the grating period or the change of the end face reflection. For a DFB laser with a uniform grating and a phase change φ of 0, it can be seen that no matter what value q takes, there is no oscillation mode of $\lambda_0=\lambda_B$, in other words, the Bragg wavelength cannot be the lasing wavelength. The two wavelengths on both sides of $\lambda_B$ correspond to the lowest mode threshold, therefore, one of them will randomly become the lasing wavelength. There are two ways to introduce a second-order grating 14 into the two first-order gratings 13 and 15:

1. A second-order grating is directly introduced into the first-order grating. In this situation, since the phase change caused by each period of the second-order grating is φ=(2π/λ)λ=2π, the introduction of the second-order grating will not change the resonance wavelength of the DFB laser. Additionally, since the mode corresponding to the resonance wavelength is different from the mode corresponding to the Bragg wavelength of the second-order grating diffraction, effective surface emission cannot take place in this case.

2. Combine the second-order grating with the first-order grating of half a period and then introduce it into the first-order grating. In this situation, the phase change of the traveling-wave field in the waveguide is φ=(2π/λ)(λ/4)=λ/2, which realizes function of the λ/4 phase shift. When q in above equation takes −1, the oscillation mode to $\lambda_0=\lambda_B$ can be obtained, so that a stationary standing wave oscillating with the Bragg wavelength can be formed in the entire waveguide, further realizing the resonance and amplification of the mode. The mode corresponding to the Bragg wavelength finally becomes the intracavity resonance mode, and the second-order grating can effectively diffract the mode upward to realize surface emission.

Figure 5:
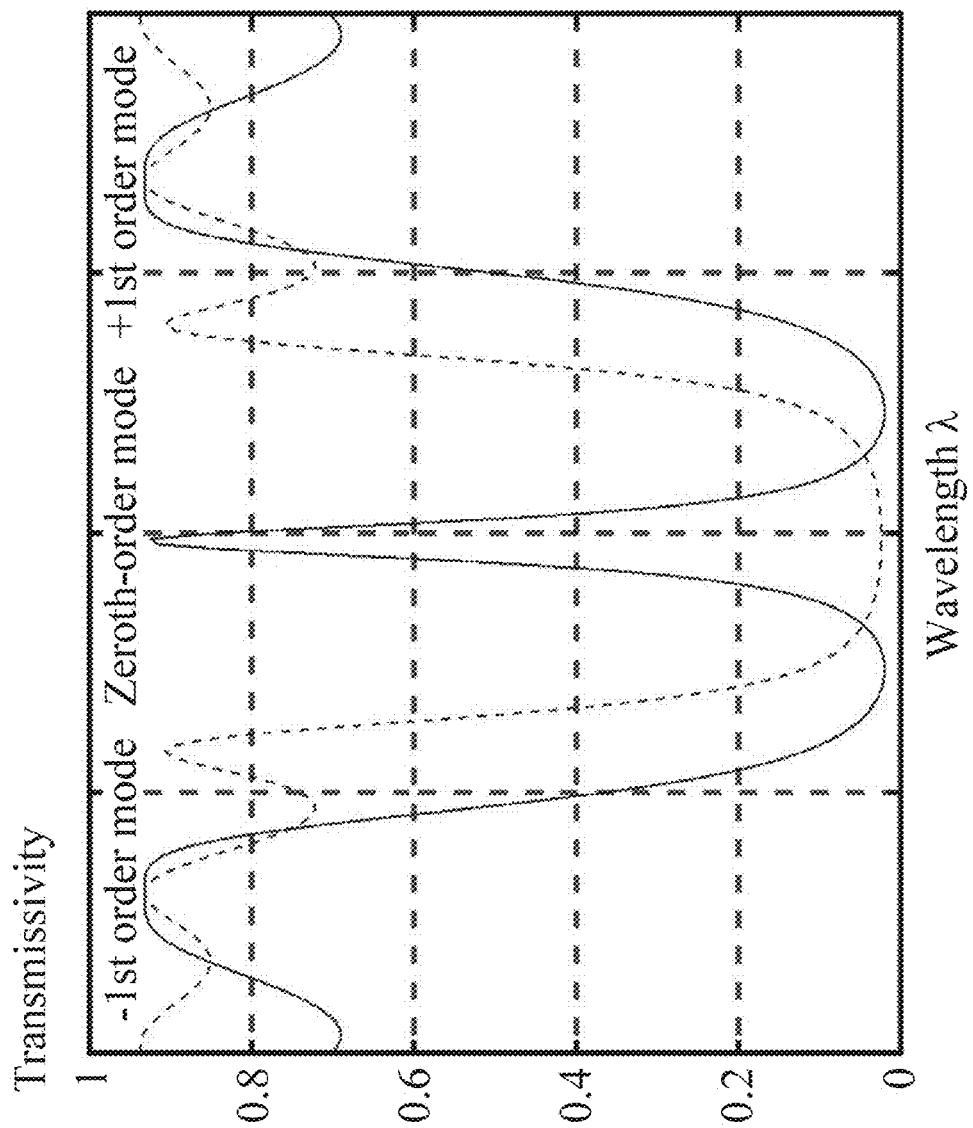
FIG. 5 is calculated transmission spectrum of a second-order grating with or without a function of $\lambda/4$ phase shift.

FIG. 5 shows the transmission spectrum calculated for the second-order grating with or without λ/4 phase shift. The disclosure adopts a second-order grating with λ/4 phase shift to implement effective mode selection (0th-order mode) and surface emission function.

Figure 6:
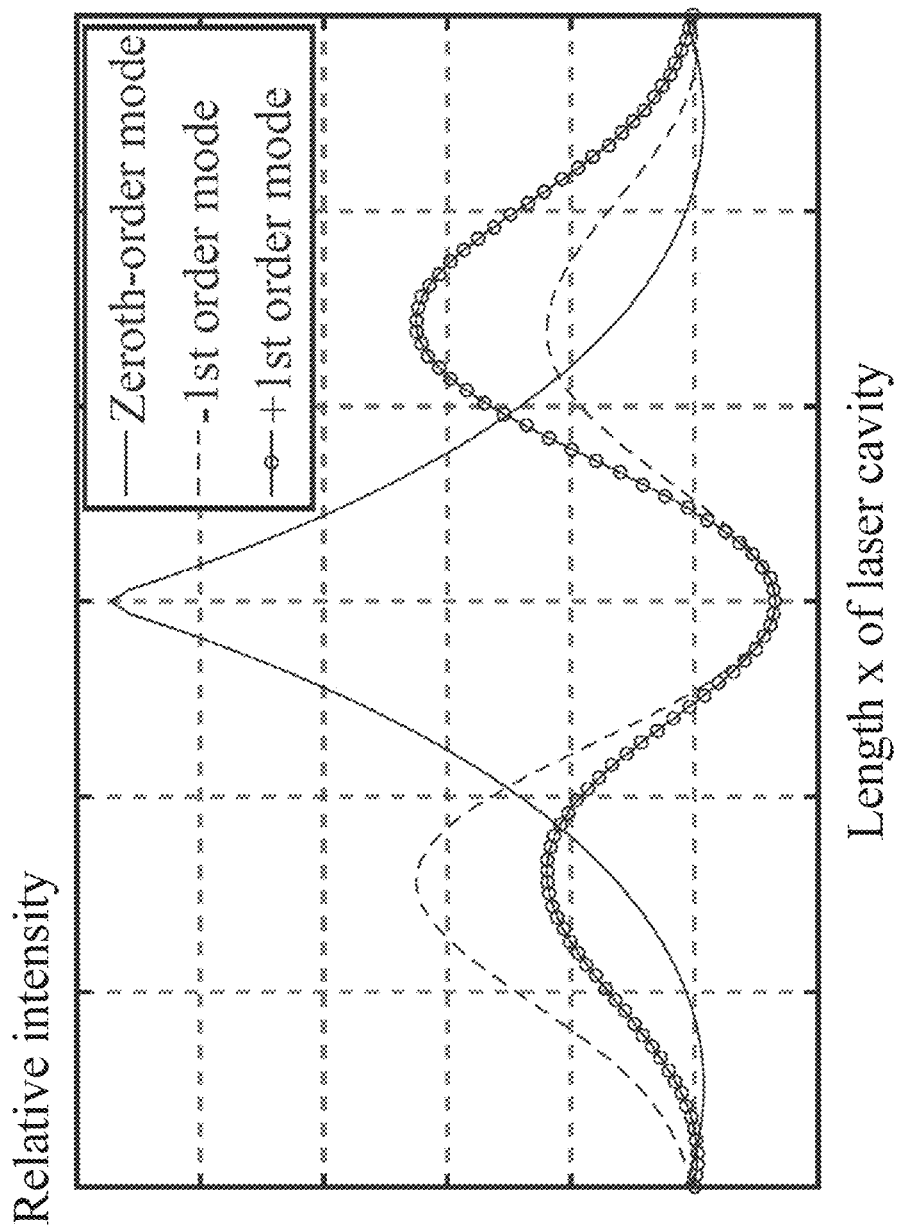
FIG. 6 is a distribution diagram of light field intensity of 0th, ±1 order modes in the longitudinal direction.

The mode feedback and amplification of the surface-emitting laser of the disclosure is mainly realized by the first-order gratings 13, 15 on both sides of the second-order grating, which means that many resonance peaks as shown in FIG. 5 (±1 order, ±2 order) is also possible to become an oscillation mode. For the standard λ/4 phase-shift DFB laser, the mode corresponding Bragg wavelength (0th-order mode) has the strongest optical feedback and the lowest threshold gain, enabling single longitudinal mode operation. However, in the disclosure, the first-order diffraction of the second-order grating causes loss to this mode (0th-order mode), which is followed by an increase of the threshold gain of the mode, resulting in the lasing mode on both sides of the mode (±1-order mode)) due to a relatively low threshold gain and lasing. In order for the laser to operate in a 0th-order mode, an additional mode selection mechanism is needed to greatly increase the threshold gain of the ±1st-order mode. An alternative method is to fabricate the metal on the first-order grating on both sides, and increase the loss of the ±1st-order mode by the absorption of the light field by the metal. However, this solution also leads to an increase of the 0th-order mode loss. The threshold current of the laser in the solution is 2 A (amperes), it has the difficulty in applying to the fields such as optical communication and optical sensing that require low power operation. Another method is to reduce the feedback capability on the ±1st-order mode by reducing the length of the first-order grating on both sides of the second-order grating, thereby increasing the threshold gain. And without increasing the 0th-order mode loss, the laser realizes gain amplification and lasing. The latter is employed in the disclosure, specific as follows:

Similar to the standard second-order grating DFB laser, the field intensity in the cavity of the surface-emitting laser of the disclosure is distributed along the length direction of the cavity: $E(z)=A(z)e^{i\beta z}+B(z)e^{-i\beta z}$, wherein A(z) and B(z) are forward and backward traveling waves in the laser cavity, and β is the propagation constant, and β=−1, 0, 1 is the main longitudinal mode. FIG. 6 shows a typical distribution of the light field intensity along the length direction of the laser cavity corresponding to 0, ±1 mode. It can be seen that the light field of the 0th-order mode is mainly concentrated in the center of the length direction of the laser cavity, and the light field of the 1st order mode is mainly distributed at both ends of the laser cavity. The 0th-order mode has the strongest optical feedback, and the light field is mainly concentrated in the center of the laser. However, the distribution of the light field at both ends of the laser is very small. Therefore, reducing the edge length of the 1st-order gratings has no effects on the 0th-order mode. For the 1st order mode, since the light field is mainly distributed at both ends of the laser, the reduction of the periods of first-order grating at both ends will greatly reduce the light-field feedback of the mode, causing the light field to leak from both ends, thereby increasing the loss and ultimately making it difficult to form a resonance. In this way, it is possible to filter out other second modes such as ±1st order mode in the case where the loss of the main mode (0th order mode) is relatively small, thus realizing the main mode lasing. This can also be observed in subsequent example simulations.

A semiconductor laser differs from a light emitting diode (LED) mainly in that it contains a resonant cavity. The resonant cavity provides feedback amplification of the photons to achieve lasing. In the disclosure, the first-order gratings at both ends of the surface-emitting laser provide the feedback of the optical field, realizing the function of the resonant cavity, and the second-order grating causes loss due to the light diffracted from the cavity, which is similar to the mirror loss caused by the end facet of the edge-emitting laser. Typically, the threshold current of the laser is proportional to the laser loss. The increase of the loss will greatly increase the threshold current of the laser. When the loss is too large, the laser will not be able to achieve lasing. The mirror loss of a typical FP cavity laser is around 30-40 cm$^{-1}$, and the corresponding threshold current is about 20 mA. To achieve low threshold lasing, the loss of the resonant cavity tends to be as small as possible. For the surface-emitting laser of the disclosure, the number of periods of second-order grating determines the power of the upwardly diffracted light field, and also affects the light field intensity in the laser cavity. Therefore, the number of periods of the second-order grating is within a reasonable range to ensure that the laser can occur at a low threshold.

Figure 7:
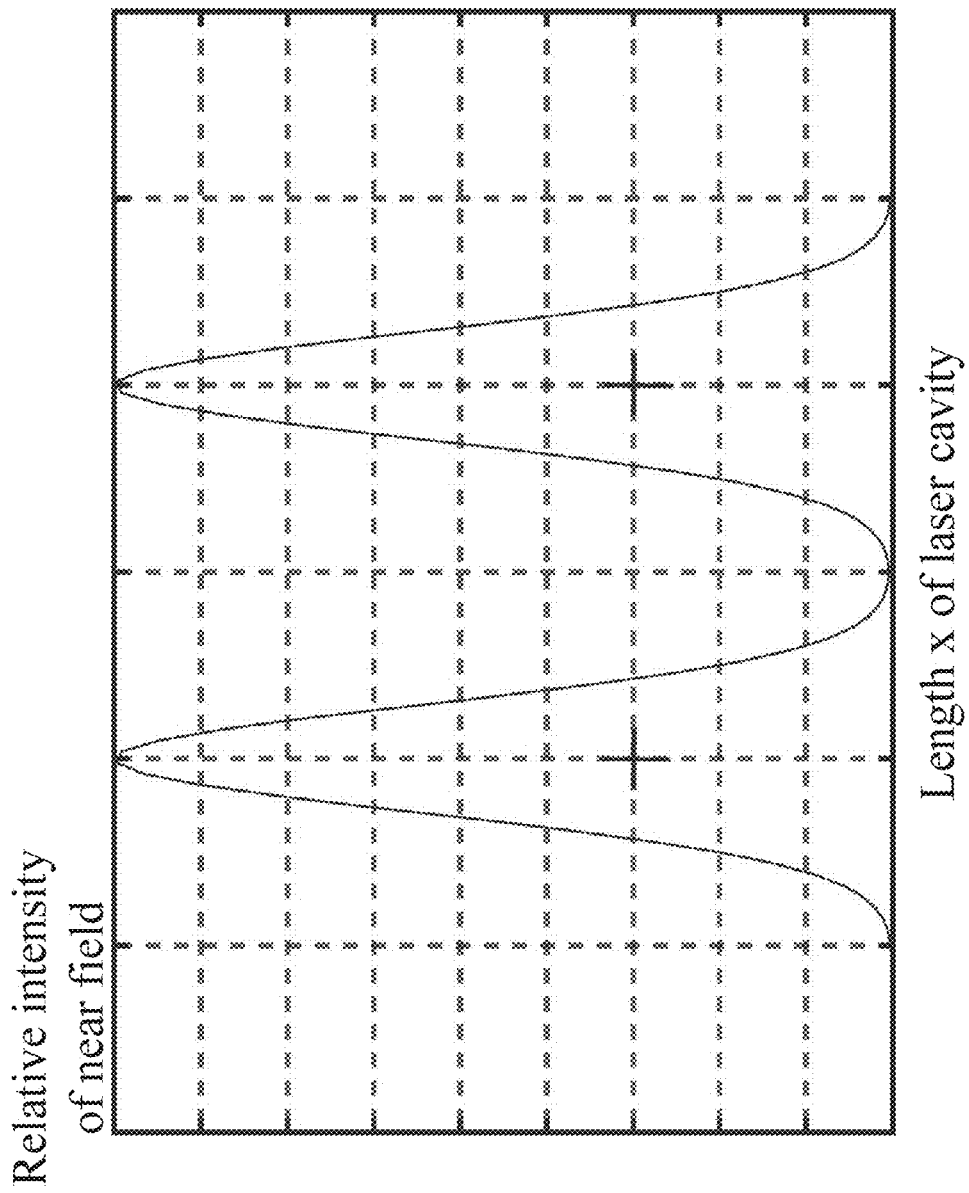
FIG. 7 is a schematic diagram of field intensity distribution and phase of the near-field output of a zeroth-order mode.
Figure 8:
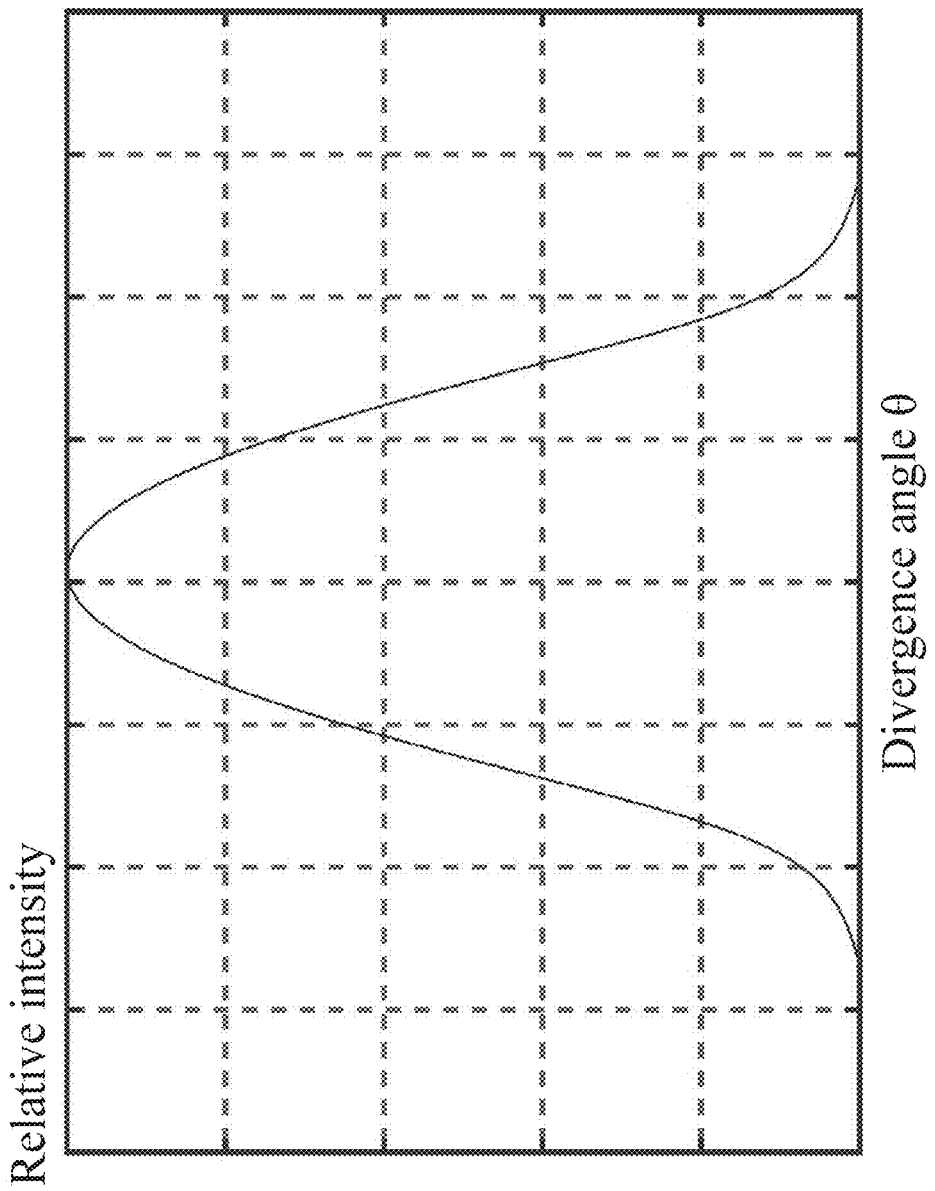
FIG. 8 is a schematic diagram of the far-field intensity distribution obtained from the symmetric near-field intensity distribution.

The 0th-order mode output by the second-order grating is a symmetric mode, that is, its amplitude and phase of near-field distribution are symmetric about its center line in the length z direction of the laser cavity. FIG. 7 shows the field intensity and phase of the near-field output of the 0th-order mode. The near-field distribution is symmetrical, that is, the phase on both sides of the center point are positive. The equation of near-field and far-field relations is as follow:

$$E_{far}(\theta) = \cos(\theta) \int E_{near}(z) e^{-ik\sin(\theta)z} dz \quad (4)$$

where $E_{far}(\theta)$ is the far-field intensity distribution at different divergence angles, $E_{near}(z)$ is the near-field intensity distribution along the z direction, $\theta$ is the divergence angle, and k is the wave vector. The far field intensity distribution can be obtained as shown in FIG. 8, which shows that the 0th-order mode transforms from the near-field to the far-field and forms a light field intensity distribution with only one peak. Typically, the far-field divergence angle is inversely proportional to the exit aperture (light-emitting area in near-field), that is, the narrower the exit aperture, the wider the angular distribution of the far-field.

For an edge-emitting semiconductor laser, the horizontal exit aperture is about 2-3 μm, the corresponding horizontal emission angle is about 20°, the vertical exit aperture is about 0.4 μm, and the corresponding vertical emission angle is about 40°. This arrangement makes the outgoing light an elliptical beam that typically has a relatively large coupling loss when coupled to the fiber. The lens system can be used to shape the beam for more efficient coupling, but this will increase the cost of the device. For a VCSEL, the outgoing light is a circular beam with a diameter of about 4 μm and a corresponding divergence angle of about 15°, and the efficiency of coupling the beam to the fiber tends to be very high. This is also a big advantage of the VCSEL compared to edge-emitting lasers. However, the length of the VCSEL cavity is small, and the relative output power is relatively small. In the disclosure, the second-order grating has a size equivalent to that of the exit aperture of the VCSEL, which means that the emission angle is equivalent to that of the VCSEL, and the high-efficiency coupling can also be realized. At the same time, the scheme for a horizontal cavity can ensure a relatively high optical output power.

In summary, the surface-emitting laser of the disclosure utilizes feedback from two first-order gratings to amplify an emitting mode corresponding to Bragg wavelength. A second-order grating containing a function of λ/4 phase shift is used to enable this mode to satisfy the resonance condition, and this mode is used to diffract in the vertical direction to form a stable laser output. The surface-emitting laser of the disclosure can achieve a larger power output in the mode corresponding to Bragg wavelength under conditions of low injection current. And the far-field of this mode has characteristics such as single peak and low divergence angle, so it can be efficiently coupled into the fiber.

Figure 9A:
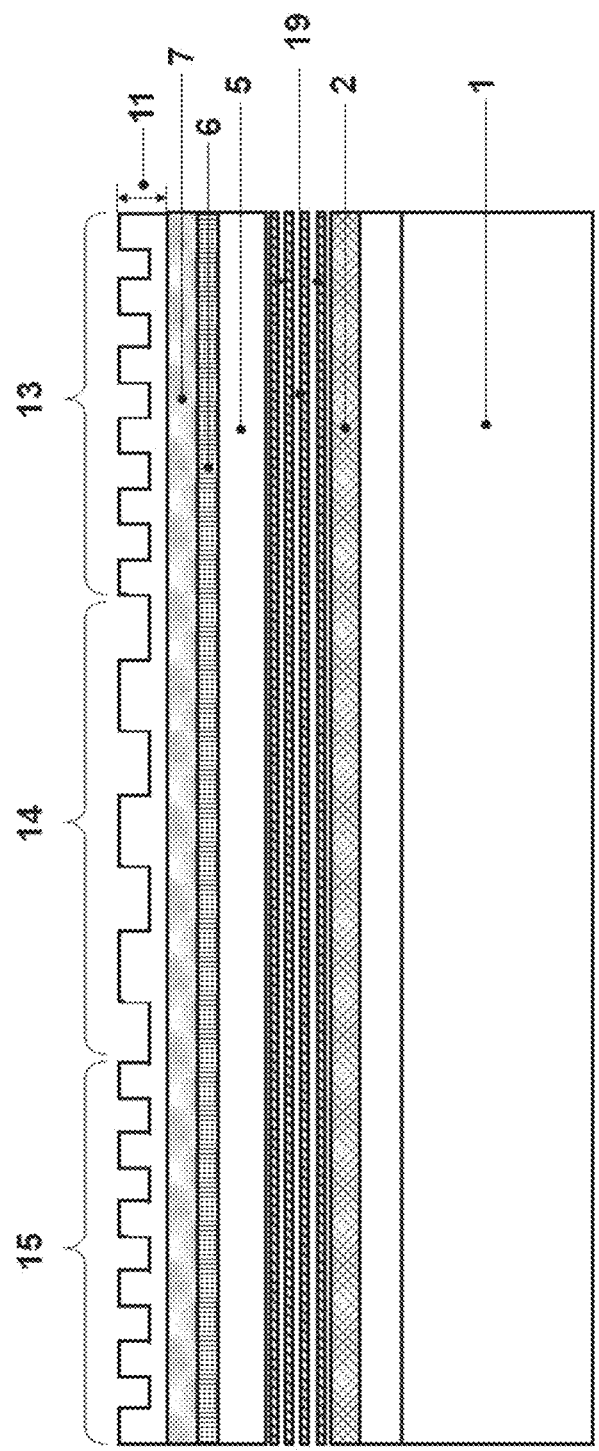
FIG. 9A is a longitudinal cross-sectional view of a laser comprising a DBR in the first cladding layer according to one embodiment of the disclosure.
Figure 9B:
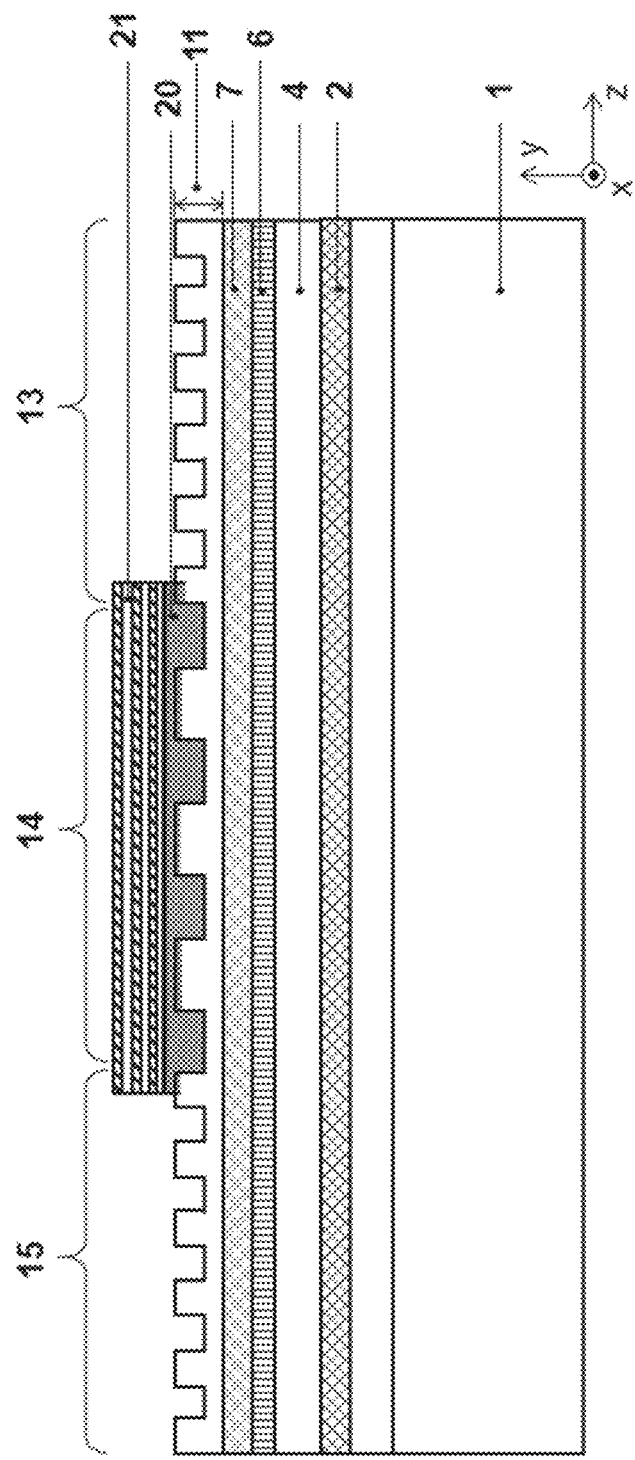
FIG. 9B is a longitudinal cross-sectional view of a laser comprising a DBR reflector on the second-order grating according to one embodiment of the disclosure.

Typically, the diffracted output of the second-order grating consists of two parts: downward and upward. As shown in FIG. 1, the laser simultaneously provides both downward and upward light output. FIG. 9A is a surface-emitting laser of the disclosure, in which the first cladding layer 5 of the laser includes an epitaxially grown DBR 19, which is disposed between the active layer 6 and the first ohmic contact layer 2 and is typically formed by alternately growing a high refractive index material and a low refractive index material. A low aluminum component layer and a high aluminum component layer are generally alternately grown on the GaAs substrate. The mirror can reflect the downward diffraction output light in the second-order grating 14 upward, and the downward diffraction output light is interfered and overlapped with the original light field of the upward diffraction output. The output optical power depends on the phase difference between the two beams, while adjusting the distance of the mirror to the active layer can control this phase difference, thereby controlling the amount of upward output optical power. FIG. 9B is another example of the surface-emitting laser of the disclosure. In this example, a dielectric isolation layer is deposited or a spin-on polymer isolation layer 20 is spin coated on the second-order grating of the laser, and then a metal-based or dielectric DBR 21 is deposited. The mirror can convert the original upward diffraction output light into a downward diffraction output light, and the downward output light is interfered and overlapped with the original downward diffraction output light, and the diffraction output optical power depends on the phase difference between the two beams, and the isolation layer is adjusted. Adjusting the thickness of the isolation layer can control the phase difference to change the downward output optical power, allowing the laser to emit light from the substrate and achieve high output efficiency.

Figure 10:
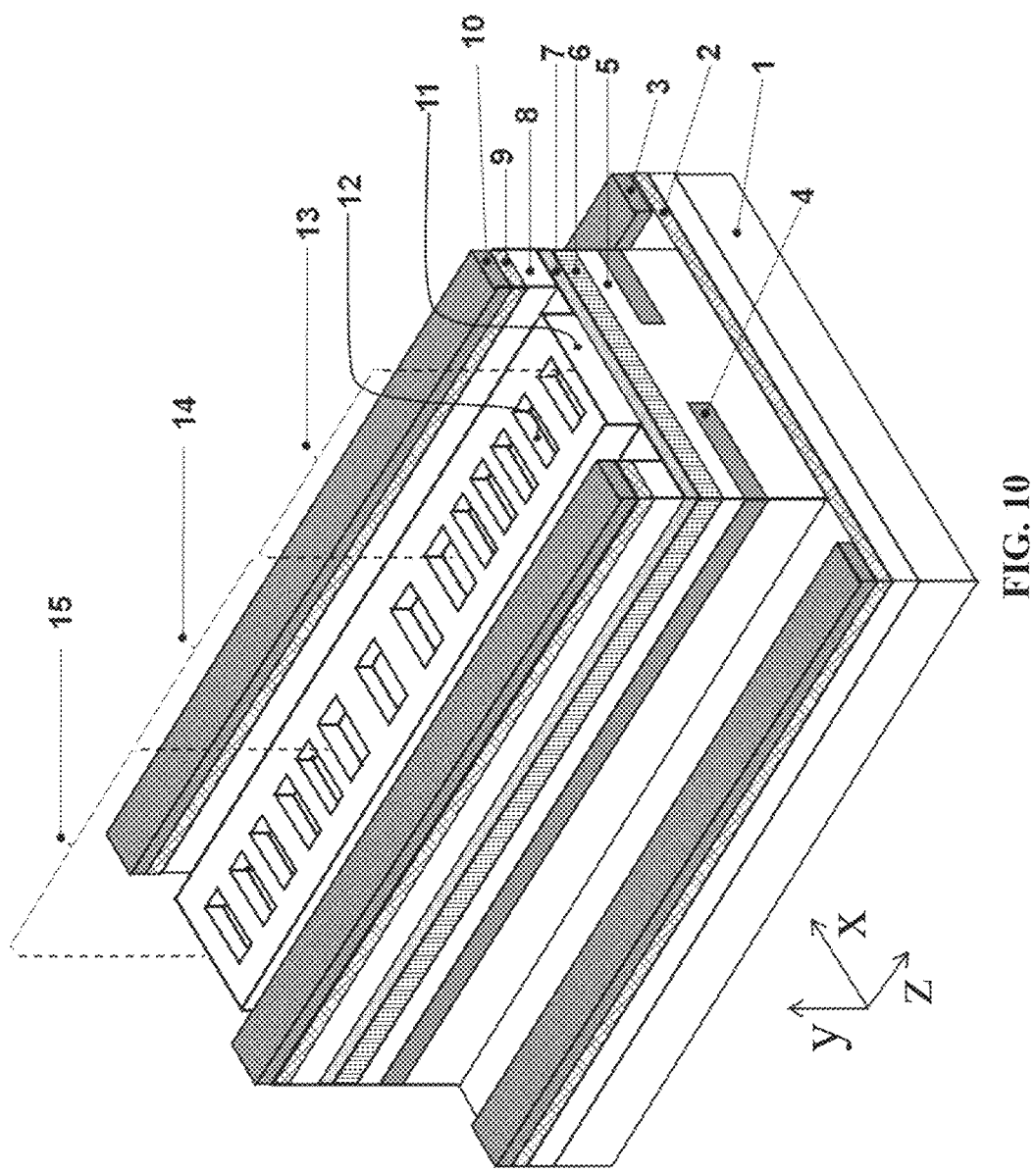
FIG. 10 is a schematic view of a grating etched in a ridge waveguide of a laser according to one embodiment of the disclosure.

In the laser shown in FIG. 1, the surface grating and the ridge waveguide have the same width. The width of the grating can be smaller than the width of the ridge waveguide, or a photonic crystal structure can be used as long as the periodic structure has the ability to provide feedback and emitting. FIG. 10 is a surface-emitting laser of the disclosure, which differs from FIG. 1 in that the grating 12 is etched into the ridge 11 and narrower than the ridge 11. In this situation, the height of the ridge waveguide and the etching depth of the grating can be controlled separately during the fabrication process.

Figure 11:
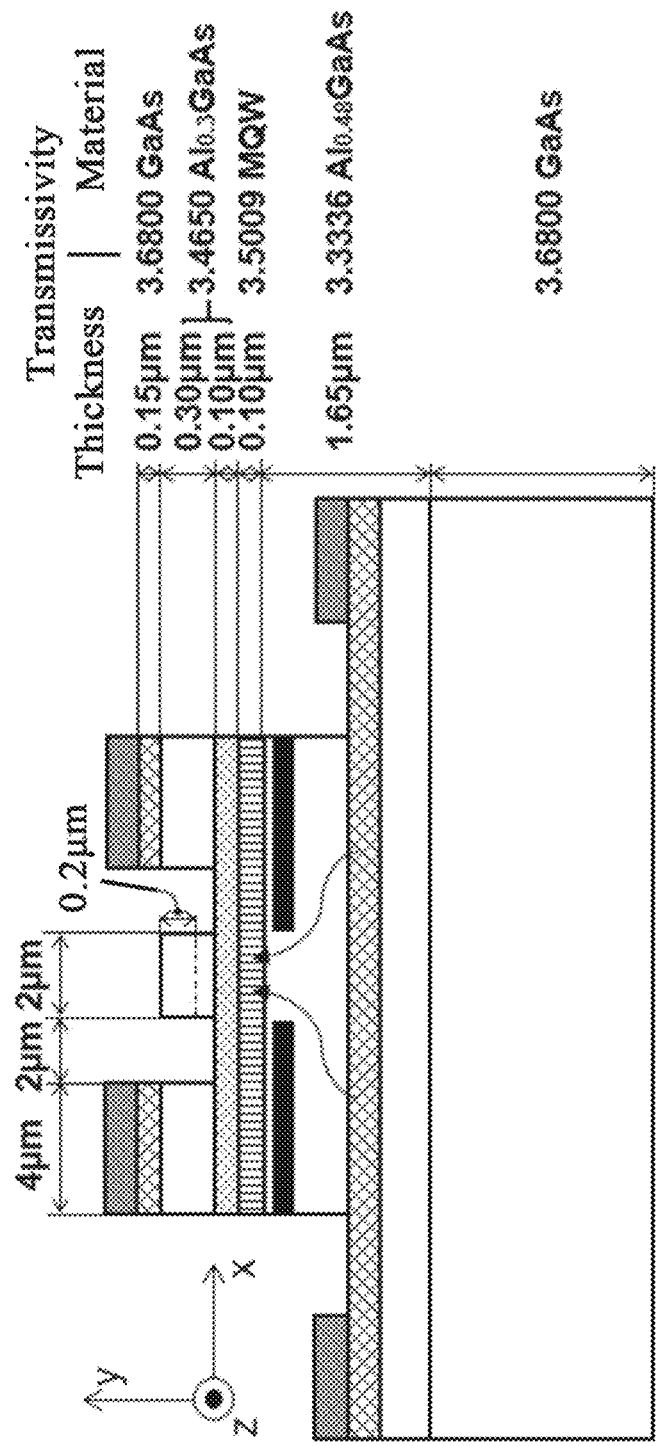
FIG. 11 is a cross-sectional view (x-y cross section) of a simulated laser.

An example of a surface-emitting laser is analyzed. The specific cross section (x-y cross section) of the laser is as shown in FIG. 11: the width of the ridge waveguide is 2 μm; the width of the electrode step on both sides is 4 μm; the distance from the ridge to the electrode step is 2 μm; the ohmic contact layer is GaAs, and the thickness is 0.15 μm; the first and second cladding layers are AlGaAs materials, the Al content is 0.3 and 0.48, respectively, the corresponding thickness is 0.4 μm and 1.65 μm the substrate is GaAs material; the active region includes multiple quantum well layers and upper and lower light confinement layers, etc., the refractive index is 3.5009 and the thickness is 0.1 μm. The oxide layer under the active region is negligible for its effect on the laser optical waveguide mode due to its relatively small thickness.

Figure 12:
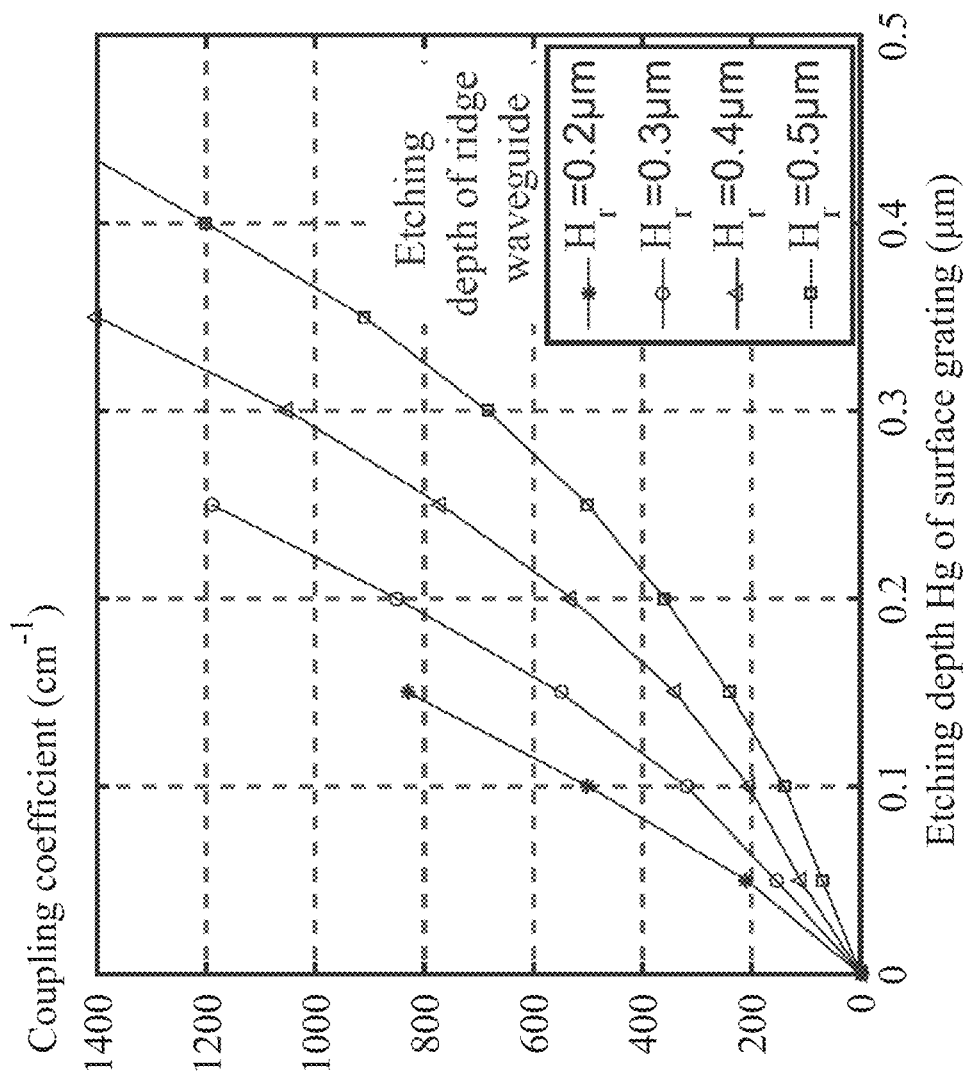
FIG. 12 shows the coupling coefficients versus the etching depth of the ridge and the gratings.
Figure 13A:
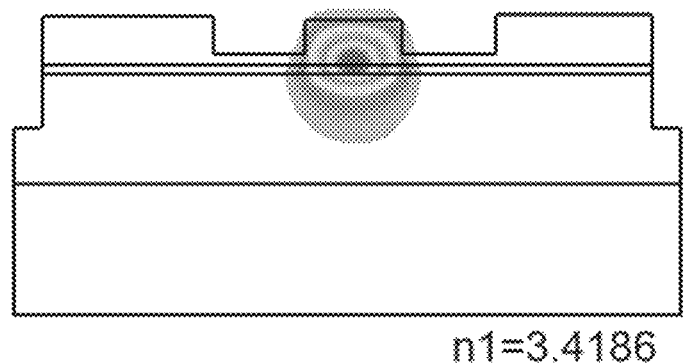
FIG. 13A is a fundamental mode distribution diagram of a ridge waveguide.
Figure 13B:
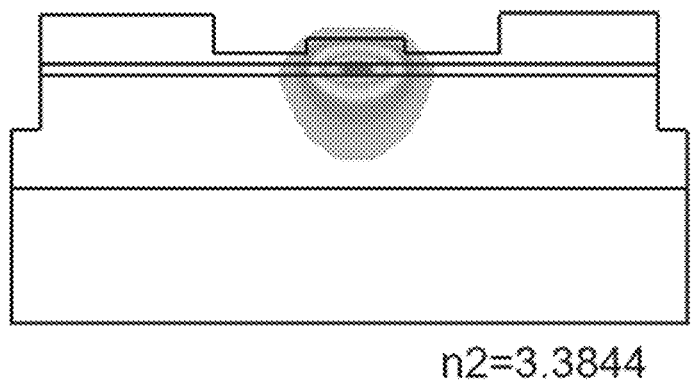
FIG. 13B is a fundamental mode distribution diagram of an etched grating region.

First, the influence of the etching depth of the ridge waveguide and the etching depth of the grating on the coupling coefficient is analyzed. FIG. 12 shows the coupling coefficients of the ridge waveguide and the grating at different depths. It can be seen that when the etching depth of the grating is constant, the coupling coefficient decreases as the etching depth of the ridge waveguide increases. In order to obtain a sufficiently large coupling coefficient, the etching depth of the ridge waveguide is reduced. However, in order to ensure that the ridge waveguide can effectively confine the waveguide mode, the etching depth of the ridge waveguide cannot be too small, and the etching depth of the ridge waveguide is selected to be 0.3 μm. When the etching depth of the ridge waveguide is constant, the coupling coefficient increases as the etching depth of the grating increases. In order to obtain a sufficiently large coupling coefficient, the grating etching depth should be increased. For the convenient fabrication, the grating is selected to be an etching depth of 0.2 μm. Fundamental mode distribution and effective refractive index of a structure composed of a ridge waveguide and an etched 0.2 μm grating are calculated, as shown in FIGS. 13A and 13B. The coupling coefficient $K=2(n_1-n_2)/\lambda=852$ cm$^{-1}$ of the grating can be obtained at 800 nm wavelength. Therefore, the feedback of the grating is strong enough to effectively reduce the length of the device. It can also be seen from FIGS. 13A and 13B that in the grating groove region, as the grating etching depth increases, the thickness of the upper confinement layer on the ridge region decreases, and more mode is transferred to the active region. When the thickness of the upper confinement layer is less than 0.1 μm, the light confinement of the waveguide in this layer is very weak, resulting in the serious lateral leakage and further illustrating that the surface grating is not suitable to be etched too deeply.

Figure 14A:
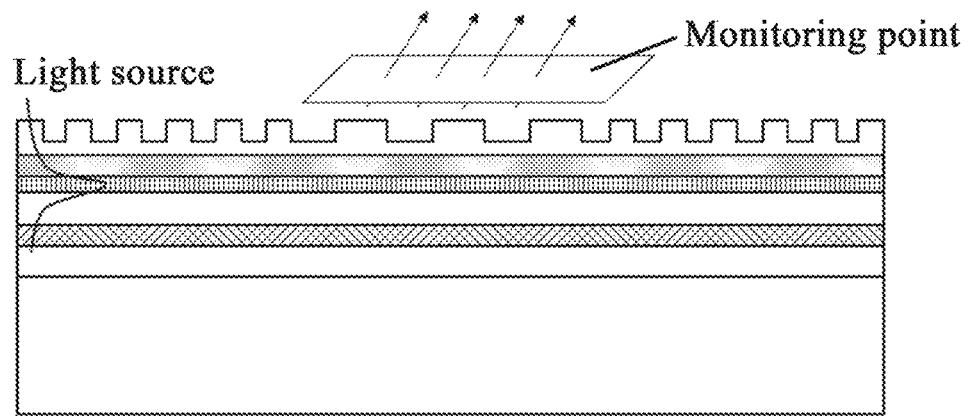
FIG. 14A is a schematic diagram of a simulated surface emitting laser without λ/4 phase shift.
Figure 14B:
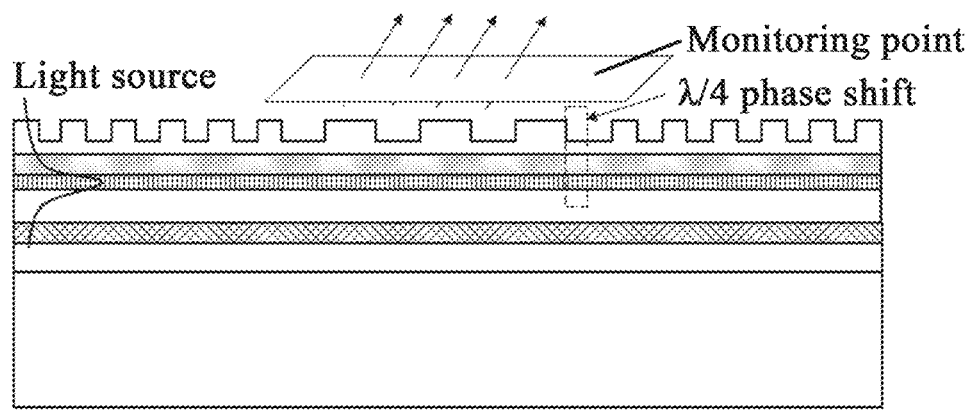
FIG. 14B is a schematic diagram of a simulated surface emitting laser with λ/4 phase shift.
Figure 15:
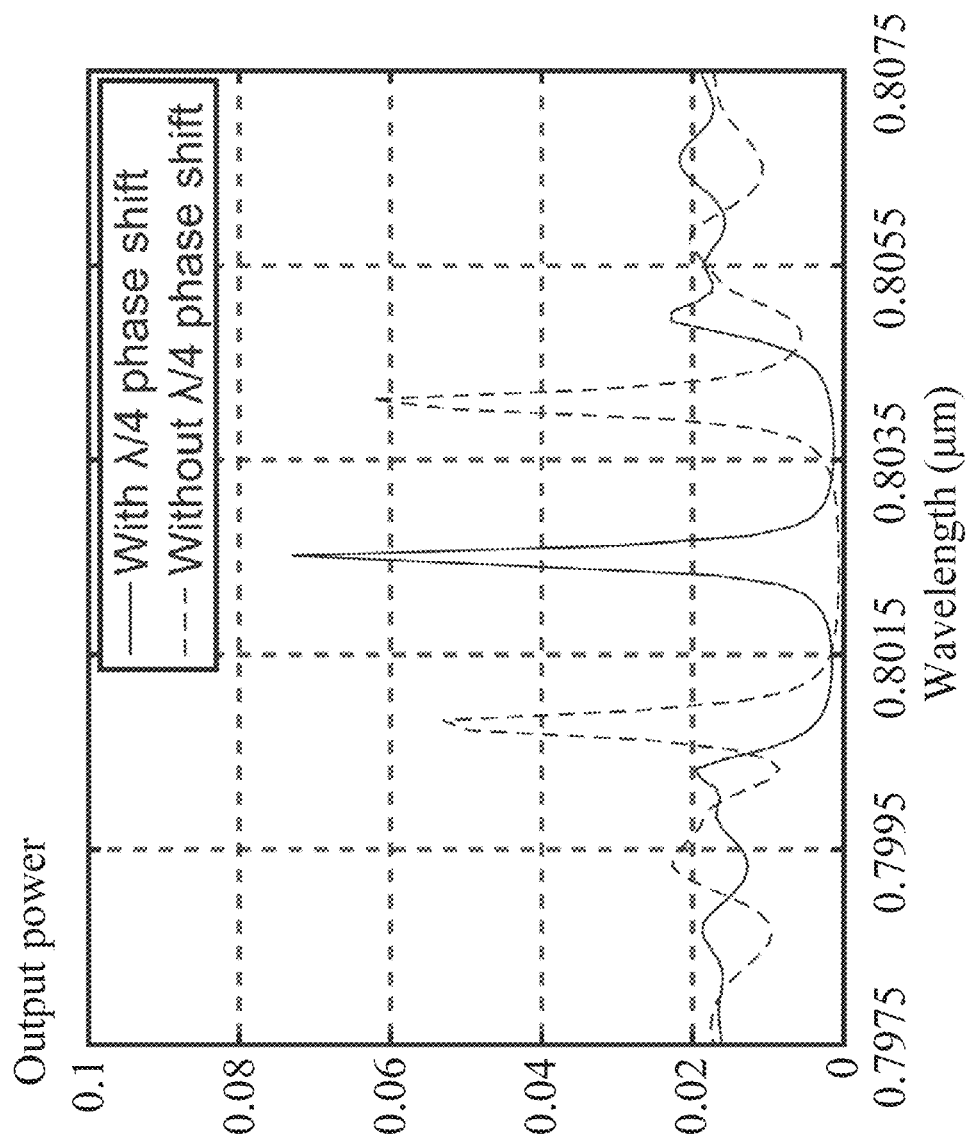
FIG. 15 shows the output power emitted vertically from a second-order grating versus wavelength with or without λ/4 phase shift in the second-order grating.

Second, the mode selection and light output characteristics of the longitudinal structure (in the z-propagation direction) are analyzed. A critical function of the second-order grating 14 in FIG. 3 is to provide a function of λ/4 phase shift, and the introduction of the λ/4 phase shifting region causes the Bragg wavelength of the grating to become the resonant wavelength of the entire resonant cavity. Another critical function of the second-order grating 14 is to use its first-order diffraction to form vertical upward output light for implementing the surface emission of the laser. The first-order diffraction wavelength of the second-order grating is a Bragg wavelength, which means that the Bragg wavelength of the grating is the resonant wavelength of the entire resonant cavity, and also the lasing wavelength of the surface-emitting laser. In order to further explain the two functions of the second-order grating, the finite difference time domain method (FDTD) is used to simulate the following: Under the above cross-sectional structure, the first-order grating periods of the longitudinal direction (along the z-propagation direction) is 117 nm, and the number of periods is 1200; the second-order grating is inserted in the middle of the first-order gratings, the period is 221 nm, the number of periods is 17; the corresponding Bragg wavelength is 802.5 nm; the waveguide fundamental mode light source is input from the left end; and the optical power at the top of the second-order grating is monitored. FIG. 14A is a schematic diagram of the simulation and size of a surface-emitting laser without λ/4 phase shift, and a phase shift of λ/4 is shown in FIG. 14B. In FIG. 14A, the first-order grating is directly inserted into a second-order grating of an integer number of periods, and the inserted second-order grating contains first-order gratings of the half-period. In other words, the second-order grating with a function of λ/4 phase shift has a half-period first-order grating longer than the second-order grating without a function of λ/4 phase shift, thus the phase of the forward and reverse traveling wave fields in the waveguide is changed by π/2, and a stationary standing wave oscillated by the Bragg wavelength is formed in the entire waveguide, thereby realizing the resonance and amplification of the Bragg wavelength. It should be emphasized that the second-order grating with a function of λ/4 phase shift may be a first-order grating with more than half a period, or a first-order grating with less than half a period, and the its position may be anywhere in the second-order grating region. FIG. 15 is a graph showing the relationship between the output power of the second-order grating on the top of the laser and the wavelength of the second-order grating obtained by the simulation in the presence or absence of the λ/4 phase shift effect. The results showed that there are two symmetrical peaks in the output optical power spectrum in the absence of the λ/4 phase shift, which means that the modes corresponding to the two peaks oscillate simultaneously, and the final lasing mode will be randomly generated from these two modes, so the laser cannot achieve a stable single-longitudinal-mode output. However, there is only one peak in the output optical power spectrum in the presence of λ/4 phase shift. The mode corresponding to the Bragg wavelength realizes resonance and the strongest feedback, thus becoming the stable lasing mode of the laser. The mode is diffracted vertically upward by the second-order grating, thereby achieving an effective output from the top surface.

Next, the influence of the number of first-order gratings on different mode quality factors in the laser cavity is analyzed. The disclosure inserts a partial second-order grating into a first-order grating, bringing the Bragg wavelength corresponding mode to resonance and then output perpendicular to the surface. Since the first-order diffraction of the second-order grating causes loss to this mode (0th-order mode), in order to avoid the threshold gain of the mode (±1st order mode) on both sides of the mode is smaller and lasing, the length of the first-order grating is shortened. The threshold gain is increased by reducing the feedback capability to the ±1st-order mode, making it easier for the 0th-order mode to achieve gain amplification and lasing.

Figure 16:
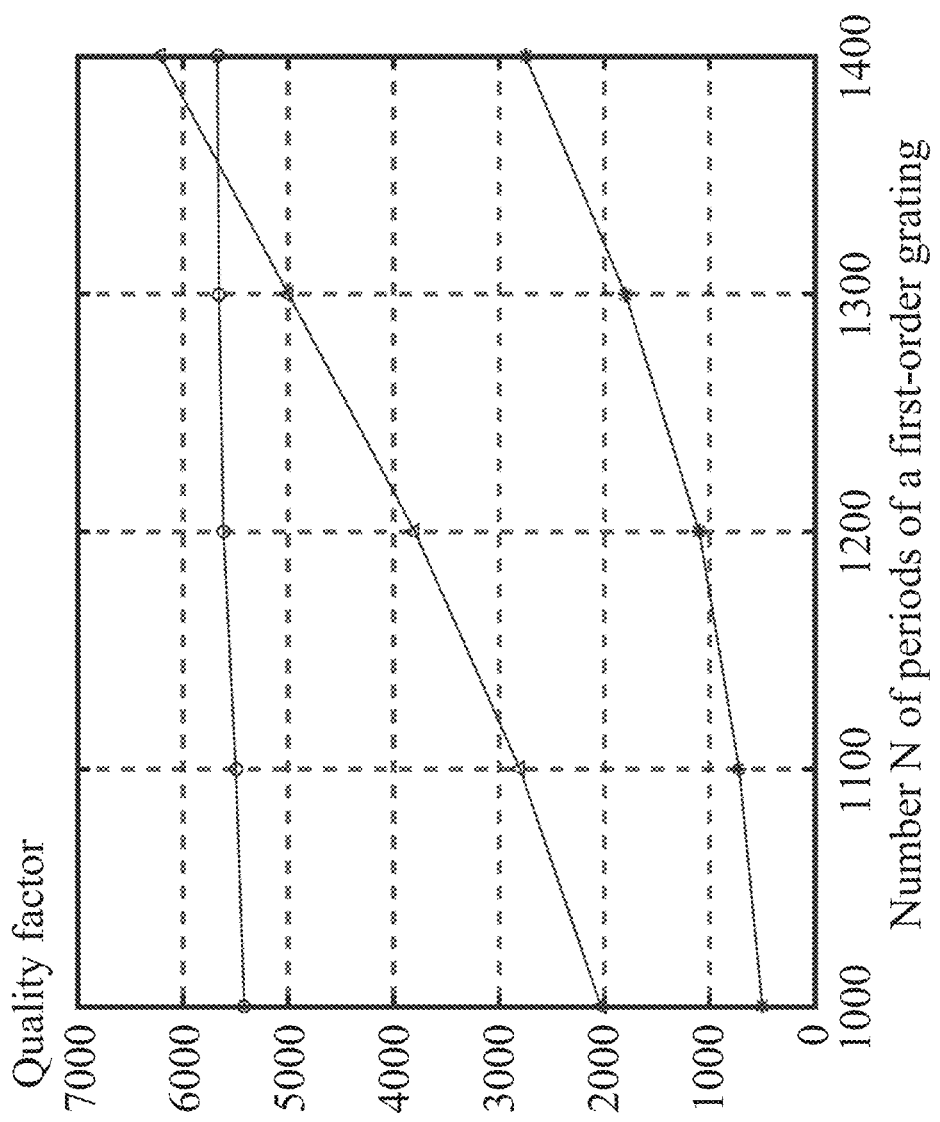
FIG. 16 shows the quality factor of main oscillating modes (zeroth-order mode and ±1st order mode) of a simulated laser versus the number of periods of the first-order grating.

In the laser resonant cavity, the quality factor can be used to determine whether a mode has the ability of lasing, because the quality factor of a mode is inversely proportional to the threshold gain, and the mode with a high-quality factor can be the lasing mode. Similar to a resonant cavity such as a microring or a microcavity, the desired resonant mode can be screened out by calculating the quality factor of the mode in the laser resonant cavity. In the above structure, the number of the periods of the second-order grating is 17, and the quality factor of each mode in the cavity is calculated by changing the number of periods of the first-order grating. FIG. 16 is a graph showing the relationship between the quality factor of the main oscillating modes (0th order mode and ±1st order mode) of the simulated laser as the number of 1st-order grating periods. It can be seen that as the number of periods of the first-order gratings decreases, the quality factor of the ±1st-order mode becomes smaller, but the quality factor of the 0-order mode is unchanged. In order to ensure that there is a large enough quality factor difference to achieve the mode screening, the number of periods of the first-order gratings can be selected to be 1200. At this time, the quality factor difference between the 0th-order mode and the ±1st-order mode reaches 2000, which is enough to make the 0-order mode become the main mode of the laser.

Figure 17A:
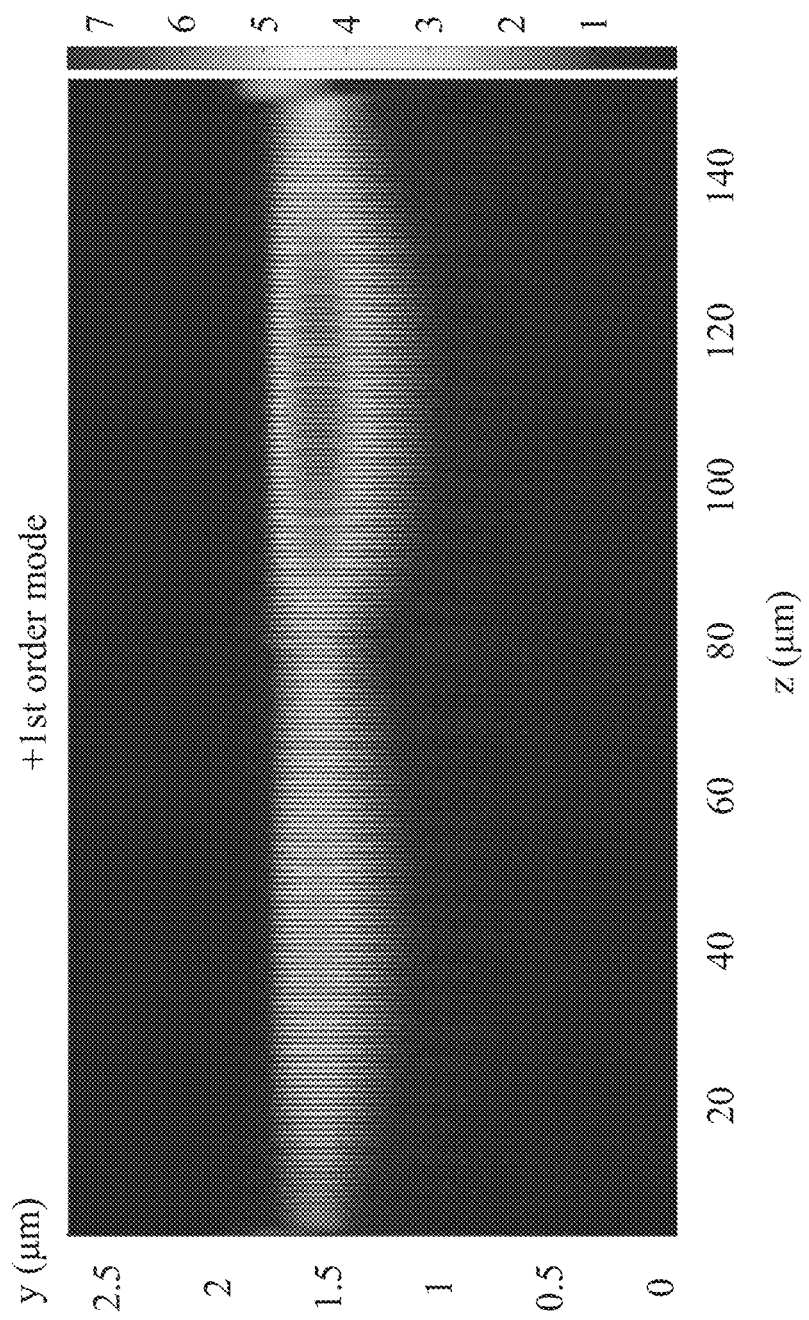
FIGS. 17A-17C show the simulated optical field intensity distribution of the 0th, 1st-order modes simulated by inserting 17-period second-order gratings between the first-order gratings of 1200 periods.
Figure 17B:
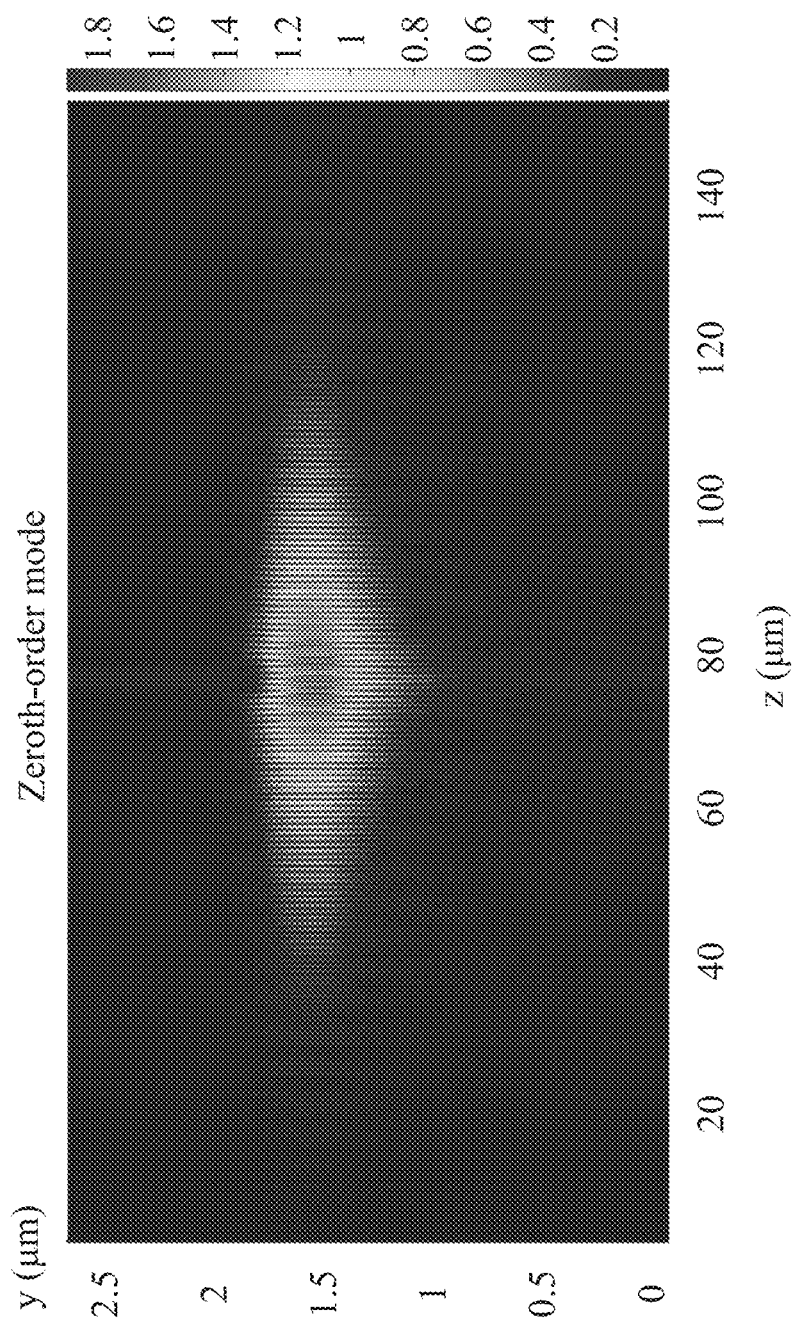
Figure 17C:
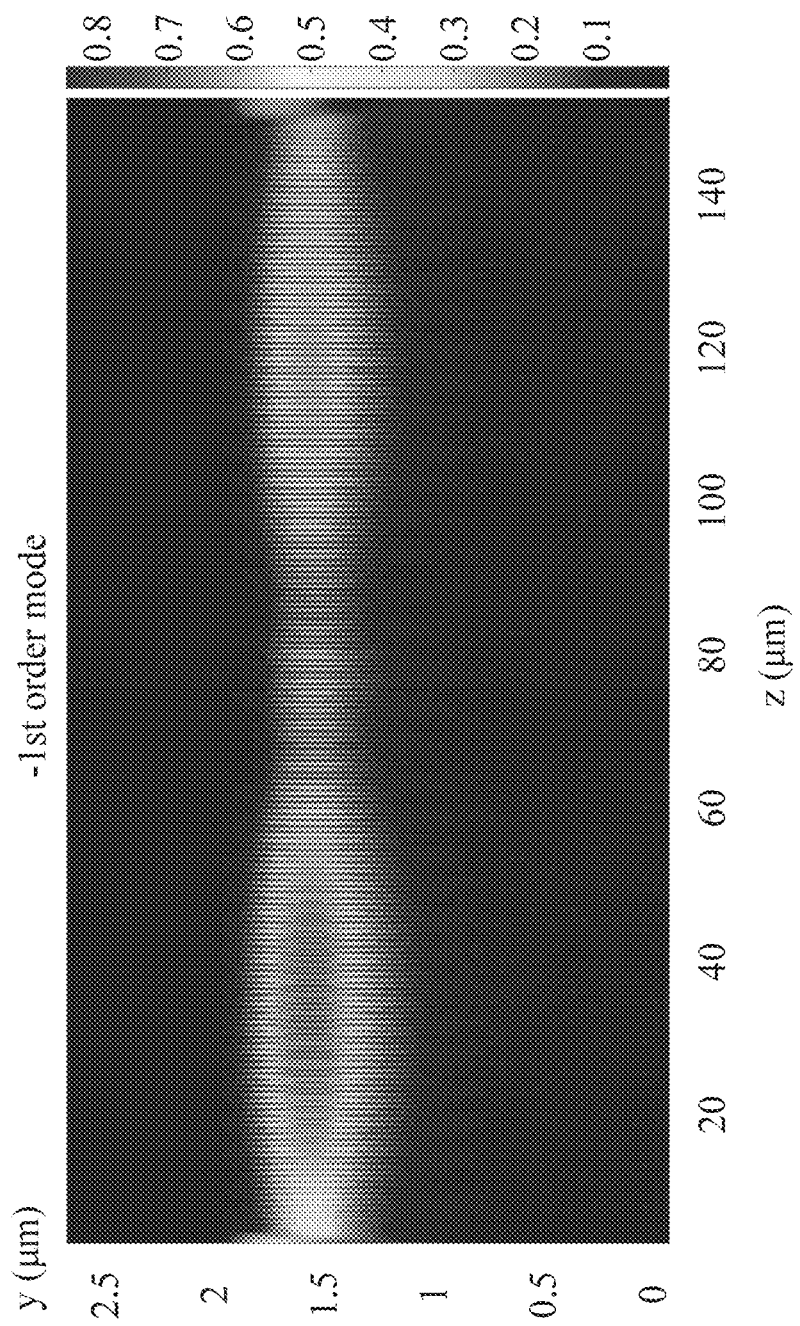

FIGS. 17A-17C show the light field intensity distribution of 0th and ±1st mode simulated by inserting second-order gratings of 17 periods between first-order gratings of 1200 periods. It can be seen that the light field of the ±1st order mode is mainly symmetrically distributed at both ends of the laser cavity, and shortening the first-order grating reduces the feedback of the light field at both ends and causes the leakage, which results in a relatively large loss, and the corresponding quality factor is drastically reduced, making it difficult to form resonance. The 0th-order mode has the strongest 1st-order grating feedback, so the light field is mainly concentrated in the center of the laser cavity. Considering that the light fields at both ends are weak, even shortening the first-order grating at both ends does not reduce the optical feedback of the 0-order mode, and have little influence on the quality factor. Therefore, shortening the first-order grating at both ends can ensure that the quality factor of the main mode (0th-order mode) is large enough, and other sub-modes such as the ±1st-order mode are filtered out.

Figure 18:
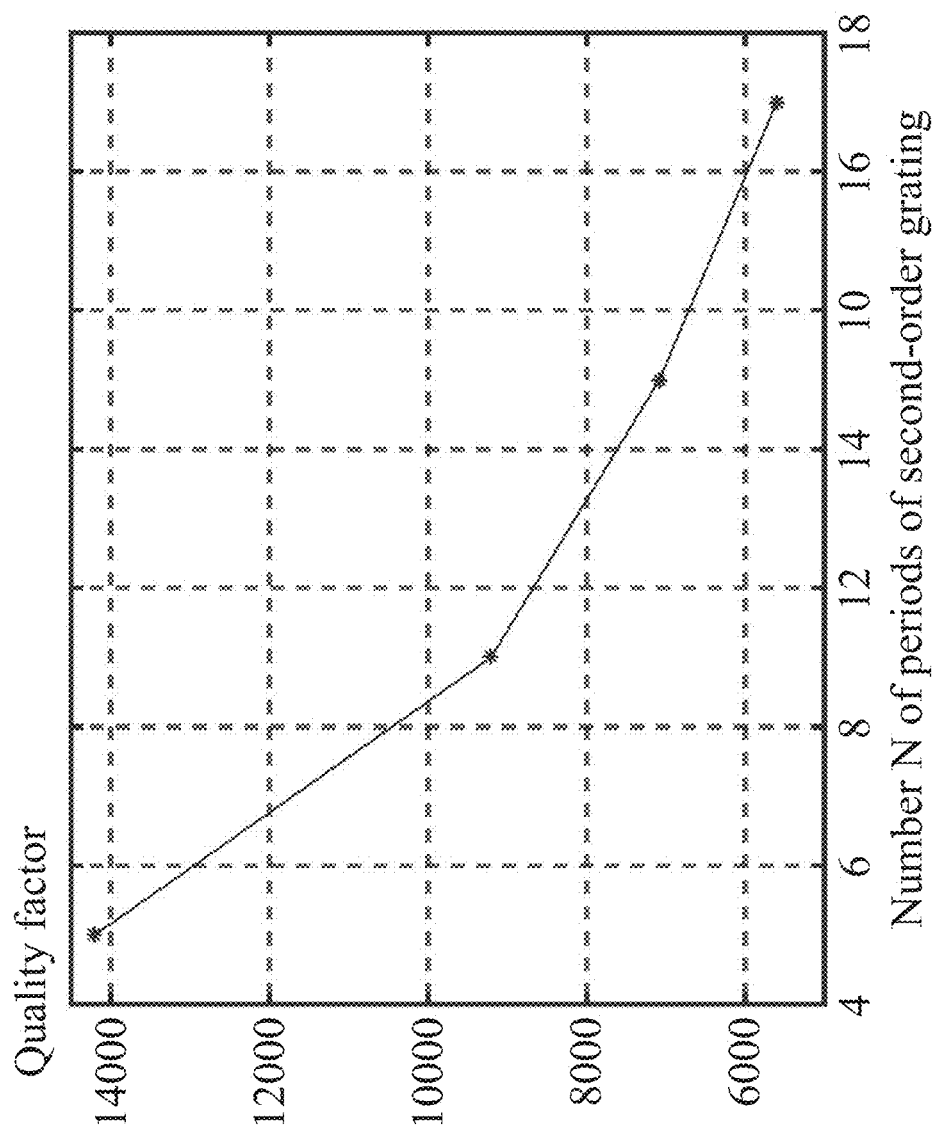
FIG. 18 shows the quality factor of the 0th-order mode of the laser versus the number of periods of second-order grating.
Figure 19:
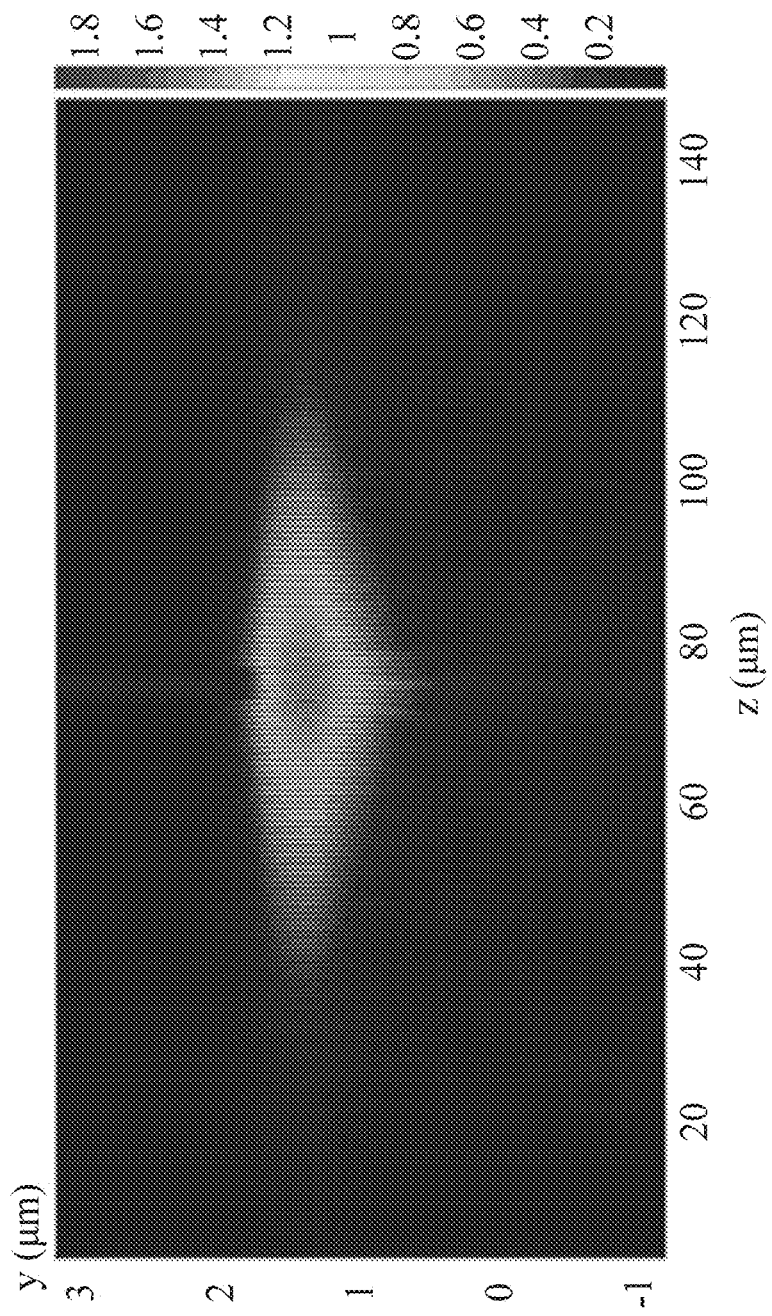
FIG. 19 shows the intensity distribution of the intra-cavity light field of a laser according to one embodiment of the disclosure.
Figure 20:
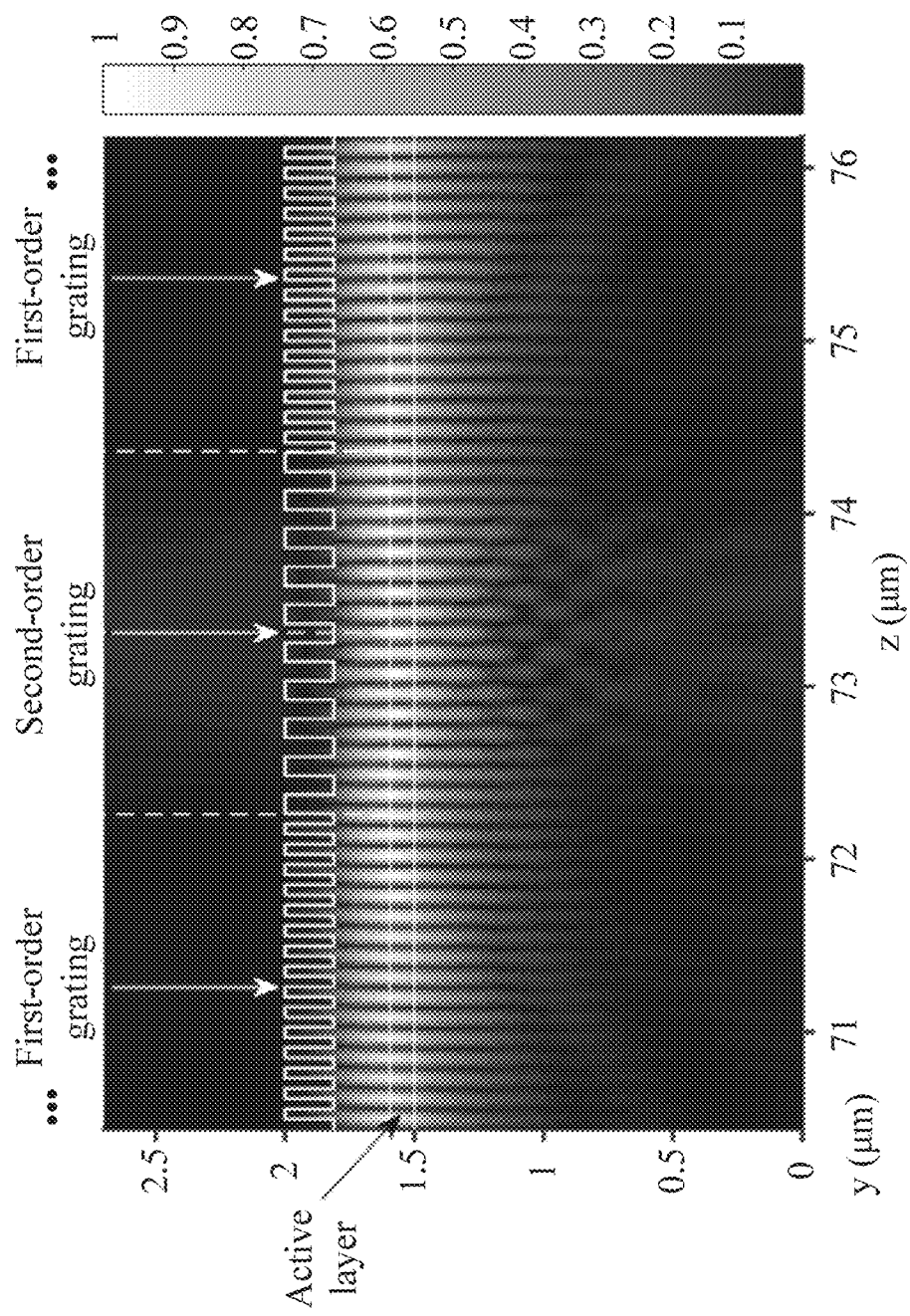
FIG. 20 shows the intensity distribution of the intra-cavity light field at a second-order grating of a laser according to one embodiment of the disclosure.
Figure 21:
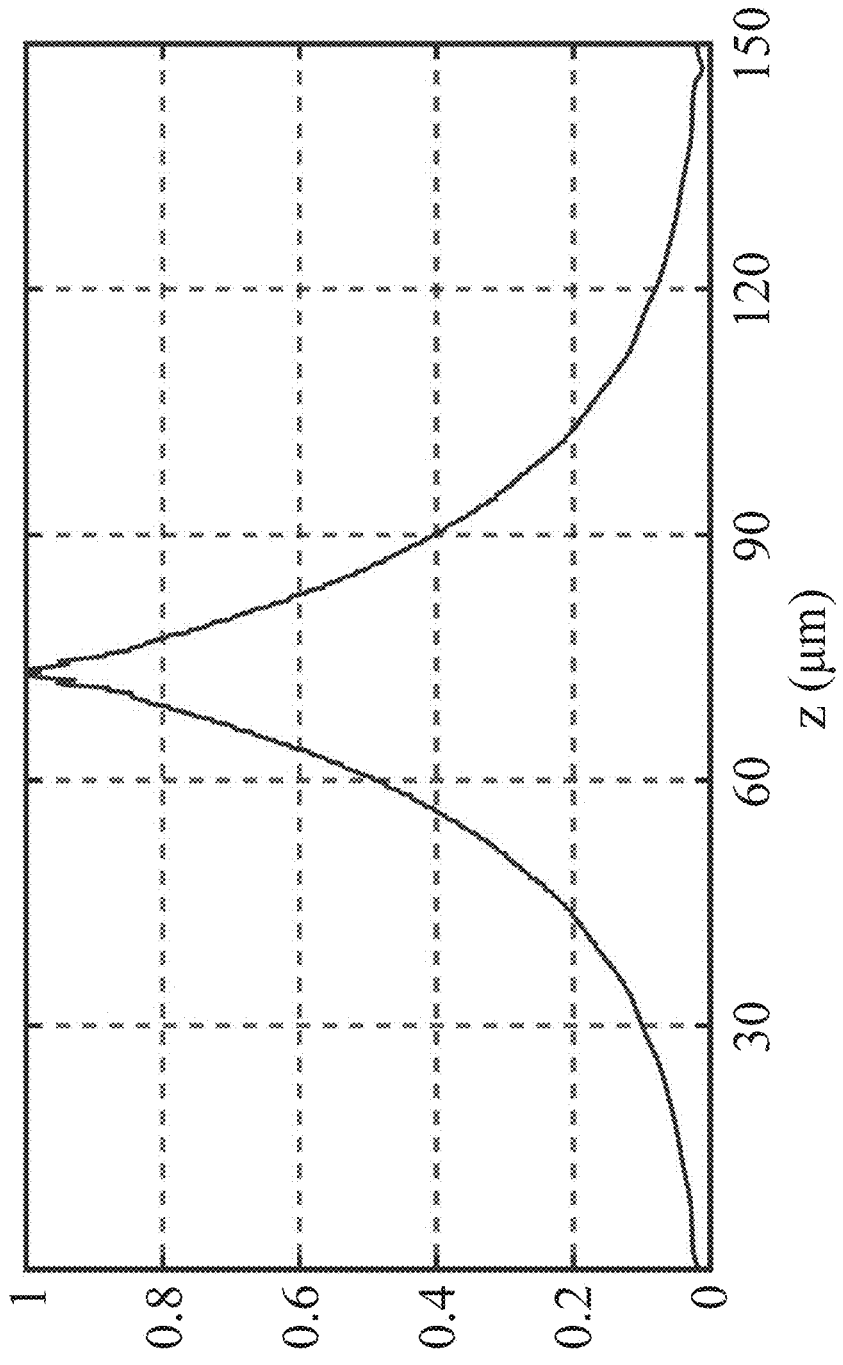
FIG. 21 shows the intensity distribution of the intra-cavity light field in the active layer along the propagation direction according to one embodiment of the disclosure.
Figure 22A:
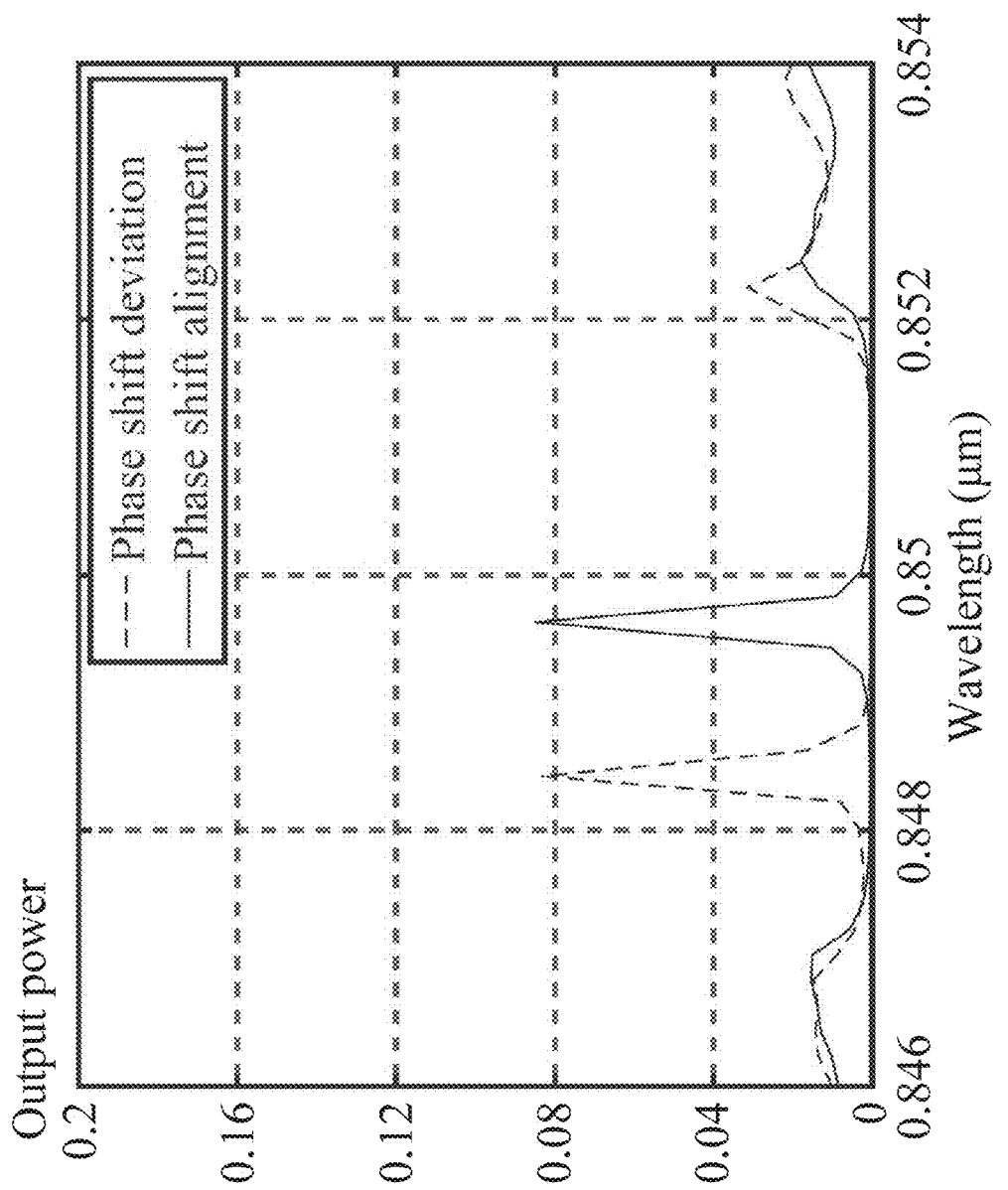
FIG. 22A is a comparison diagram of an upward output spectrum for the introduced λ/4 phase shift with or without a phase deviation when the number of periods of the second-order grating is 9 according to one embodiment of the disclosure.
Figure 22B:
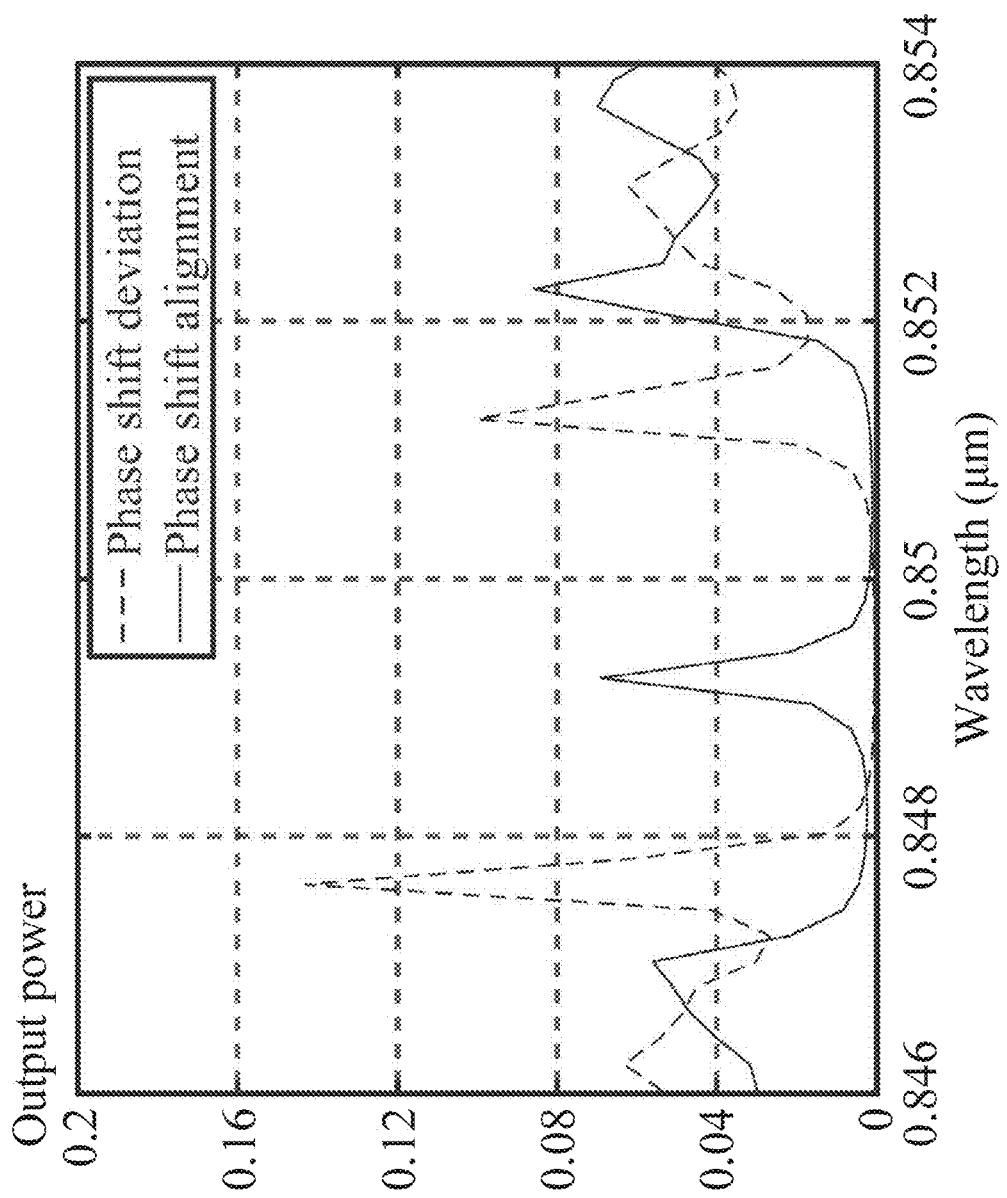
FIG. 22B is a comparison diagram of the upward output spectrum for the introduced λ/4 phase shift with or without a phase deviation when the number of periods of the second-order grating is 33 according to one embodiment of the disclosure.

Next, the influence of the number of periods of the second-order grating on the mode quality factors are analyzed. Typically, the length of the FP cavity laser is about 300-400 µm, and the quality factor corresponding to the mirror loss is about 8500-11500. In the disclosure, the number of periods of the second-order grating can be decreased to reduce the output optical power of the 0th-order mode, thereby achieving effective optical feedback amplification. Based on the above structure, the number of periods of the first-order gratings is 1200, and the number of periods of the second-order grating is changed to calculate quality factors of different modes. FIG. 18 shows the relationship between the quality factors of 0th-order mode of the simulated laser cavity as the number of periods of second-order grating. It can be seen that as the number of periods of the second-order grating decreases, the quality factor of the 0-order mode gradually increases. This is because the diffraction of the light field is reduced after the second-order grating length is shortened, so that the loss of the mode is reduced, and the corresponding quality factor is increased. However, when the number of periods continues to decrease to 5, the quality factor reaches 14000, indicating that the diffraction of the second-order grating is small at this time, which means that the optical power output upward is small. In order to ensure that there is a large enough quality factor to implement the resonant amplification of the mode, and the output power of the laser is sufficiently strong, the number of periods of the second-order grating is chosen to be 9. At this time, the calculated 0th-order mode quality factor is 9203, which ensures that the threshold gain of the mode is moderate; the calculated 1st-order mode quality factor is 0 (the mode has no effective resonance, which is basically not observed in the calculation) and 4571, less than half of the 0th-order mode means that the 0th-order mode is effectively dominant in the final output spectrum of the laser. FIG. 19 is a light field diagram of the laser cavity in the disclosure, wherein the first-order gratings have a period of 1200, and the intermediate second-order grating has a period of 9, and the ridge waveguide has a width of 2 µm. As can be seen from FIG. 19, the first-order gratings at both ends provide optical feedback, and the second-order grating in the central region provides a phase shift, and then the vertical cavity surface achieves surface-emitting output. FIGS. 20 and 21 are respectively a light field distribution diagram of the laser cavity of this example. It can be seen that the light field is concentrated in the central region of the laser cavity, which is consistent with the distributed feedback (DFB) laser with standard $\lambda/4$ phase-shift. Since the central region is a second-order grating, the light field is concentrated in this area. The light is diffracted in the vertical direction to achieve effective surface emission. It should be emphasized that the number of periods of second-order grating cannot be too much. On the one hand, the growth of second-order grating can lead to a weakening of the single model of the laser. When all gratings are selected from second-order gratings, its mode is dual-mode that is similar to a DFB laser without phase shift, and a $\lambda/4$ phase shift needs to be inserted in the second-order grating, which is actually the 2nd-order grating DFB lasers with $\lambda/4$ phase shift. On the other hand, the relationship between the near-field and the far-field shows that the growth of the second-order grating results in the decrease in the far-field divergence angle in the propagation direction. Considering that the width of the grating on the ridge waveguide is generally 2-5 µm the corresponding divergence angle is 10°-20°, and when the length of the second-order grating is 500 µm and the corresponding divergence angle is only 0.06°, which forms an elliptical outgoing beam and then displays a relatively large coupling loss when coupling with fiber. Further, the growth of the second-order grating results in an increase in the light intensity diffracted in the vertical direction, meaning that the loss becomes large and the threshold current becomes high. FIGS. 22A and 22B shows the output spectra of the laser when the number of periods of the second-order grating is 9 and 33 and the introduced $\lambda/4$ phase shift is slightly deviated. It can be seen that, compared with the case where the number of periods of the second-order grating is 9, when the number of periods of the second-order grating is 33, the phase deviation of the $\lambda/4$ phase shift causes the output power of the two wavelengths to be relatively strong, resulting in dual-mode competition of the laser.

Figure 23:
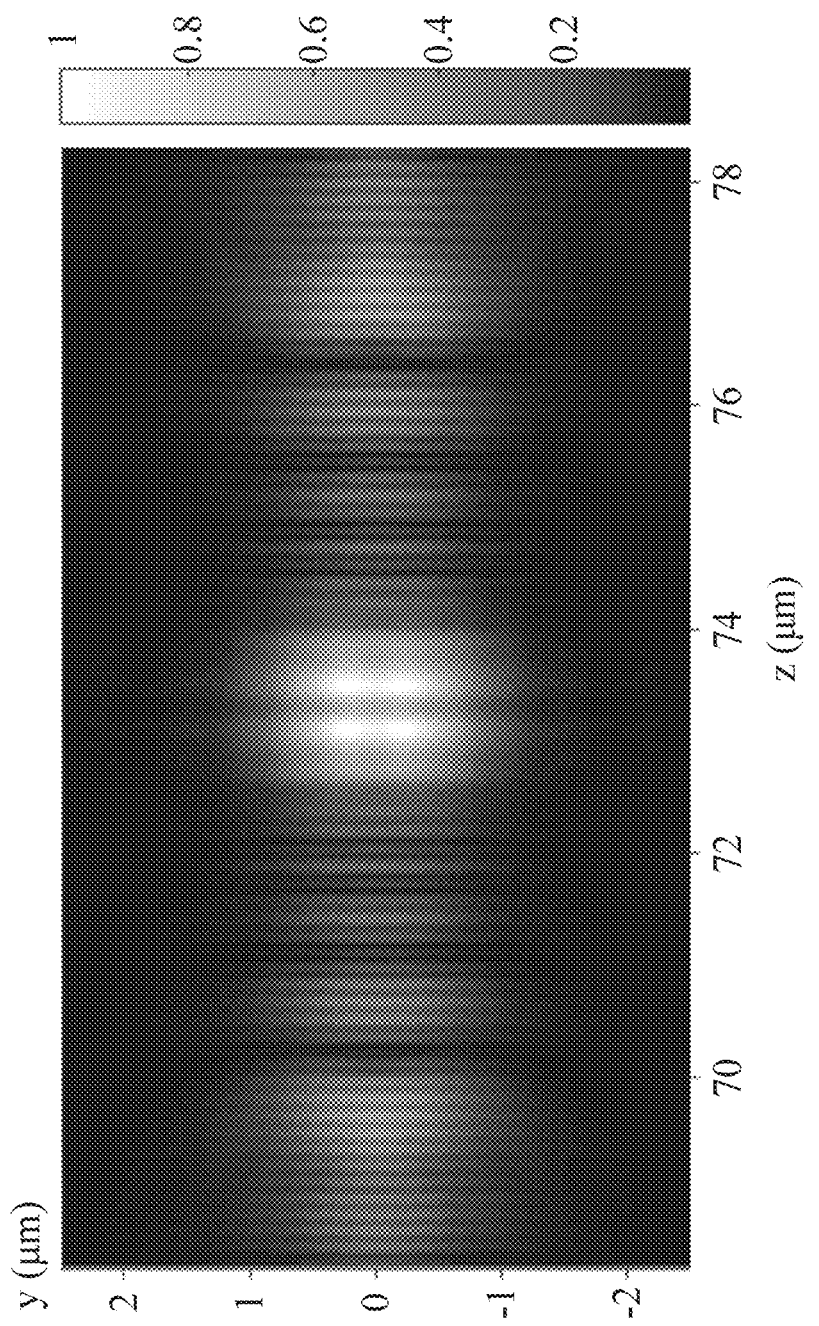
FIG. 23 shows the intensity distribution over the plane (y-z plane) of the near-field of the zeroth-order mode when the number of periods of the second-order grating is 9.
Figure 24:
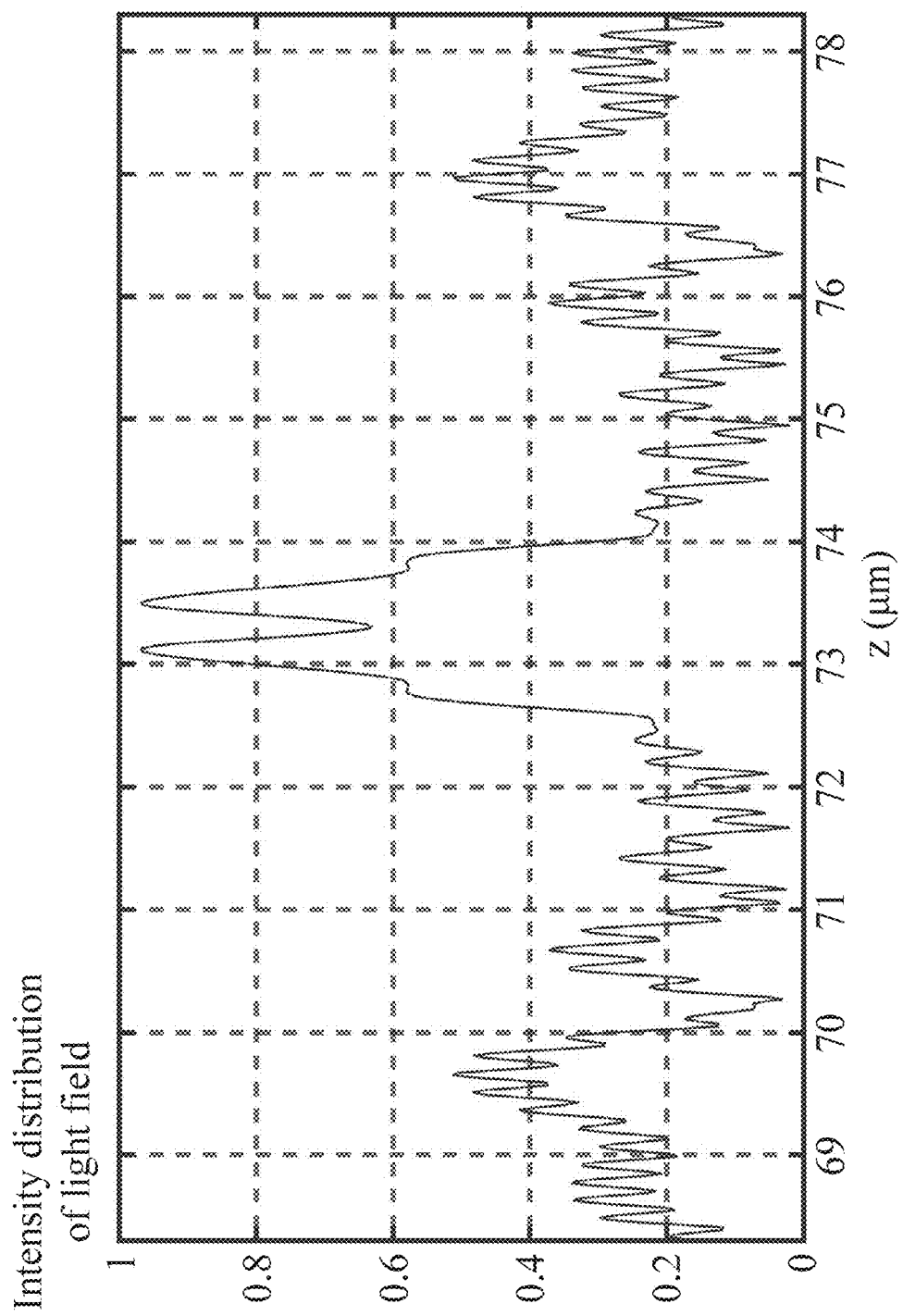
FIG. 24 shows the intensity distribution along the propagation direction (z direction, y=0 μm) of the near-field of the zeroth-order mode when the number of periods of second-order grating periods is 9.
Figure 25:
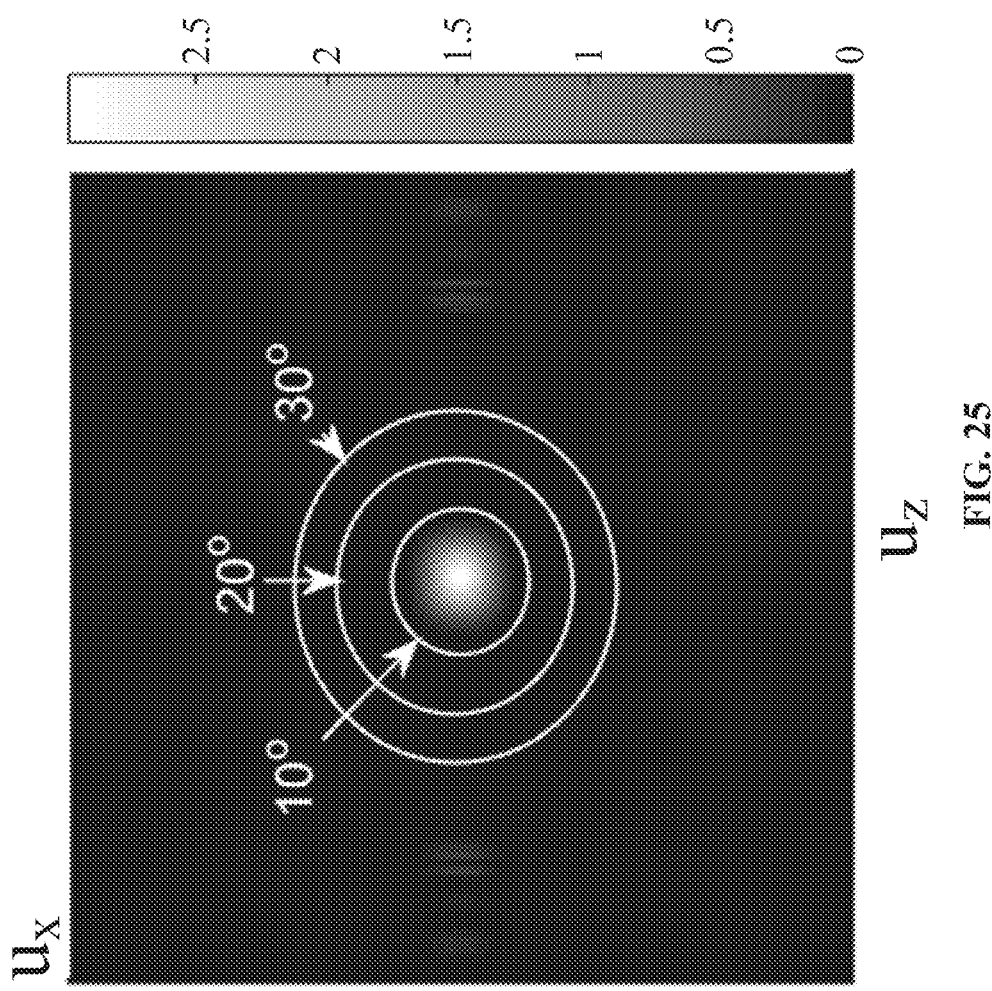
FIG. 25 shows the far-field intensity distribution (x-z plane) of the vertically scattered light in the second-order grating region according to one embodiment of the disclosure.

The near and far field intensity distribution in the 0th order mode is analyzed. Since the 0th-order mode output by the second-order grating in the vertical direction is a symmetric mode, the near-field distribution amplitude and phase are symmetrical about the centerline. This will result in a far field intensity distribution with only one peak after transformation to the far field. FIGS. 23 and 24 are planes (x-y planes) of the near-field of the 0th order mode and the intensity distribution along the propagation direction (y=0 µm) in the second-order grating period of the above-mentioned example, respectively, and it can be seen that the light field is symmetrically distributed along the centerline. FIG. 25 is a distribution diagram of the far-field intensity of the light field in the second-order grating region of the above example. It can be seen that the far-field of the output beam is a circular spot, and the far field divergence angle is about 8°×8°, which can realize single mode and single-lobed Gaussian beam output. It can be seen that the surface-emitting laser of the disclosure realizes a Gaussian beam output with a divergence angle of about ½ of that of a conventional vertical cavity surface emitting laser. Such a small divergence angle of Gaussian beam and fiber can achieve efficient coupling.

Figure 26:
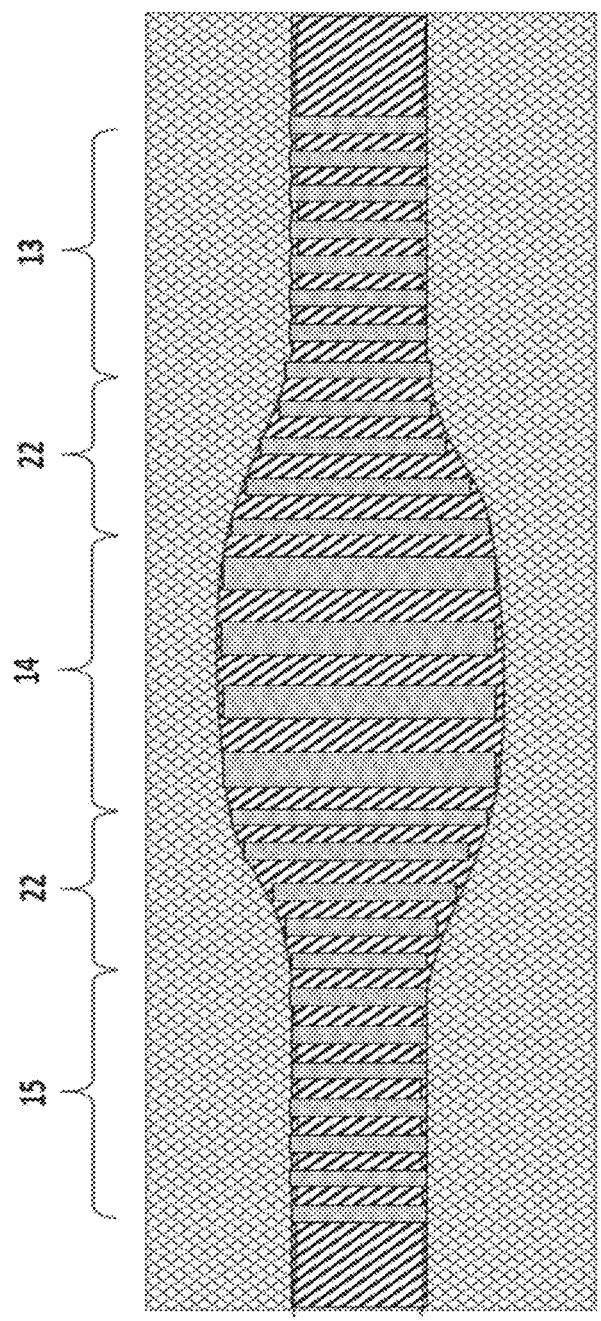
FIG. 26 is a schematic diagram of a surface-emitting laser with a taper.

It is emphasized that if a surface-emitting laser with high output power is required, the number of periods of the second-order grating can also be increased. After the second-order grating is grown, the optical power output in the vertical direction will increase, and the quality factor of the mode will decrease. Therefore, it is necessary to reduce the etching depth $H_g$ of the grating to reduce the coupling coefficient of the grating, thereby reducing the upward coupling output of the light field to increase the quality factor of a mode. At the same time, after the second-order grating is grown, the far-field longitudinal divergence angle of the mode will become smaller. To ensure that the far-field of the output is a circular beam, it is necessary to increase the width of the ridge waveguide of the second-order grating region in order to simultaneously reduce the lateral divergence angle. In addition, in order to ensure that the threshold current is as small as possible, the ridge waveguide width of the first-order grating region needs to be as narrow as possible, so that the ridge waveguide width transition structure between the first-order grating and the second-order grating needs to be designed. It is generally possible to design a taper where the ridge waveguide width is sinusoidal type variated. This taper needs to be long enough, thereby reducing the mode conversion loss. FIG. 26 is a schematic illustration of a transmissive laser having a width transition structure of the disclosure, with a width transition structure 22 being designed between the first-order gratings 13, 15 and the second-order grating 14.

Figure 27:
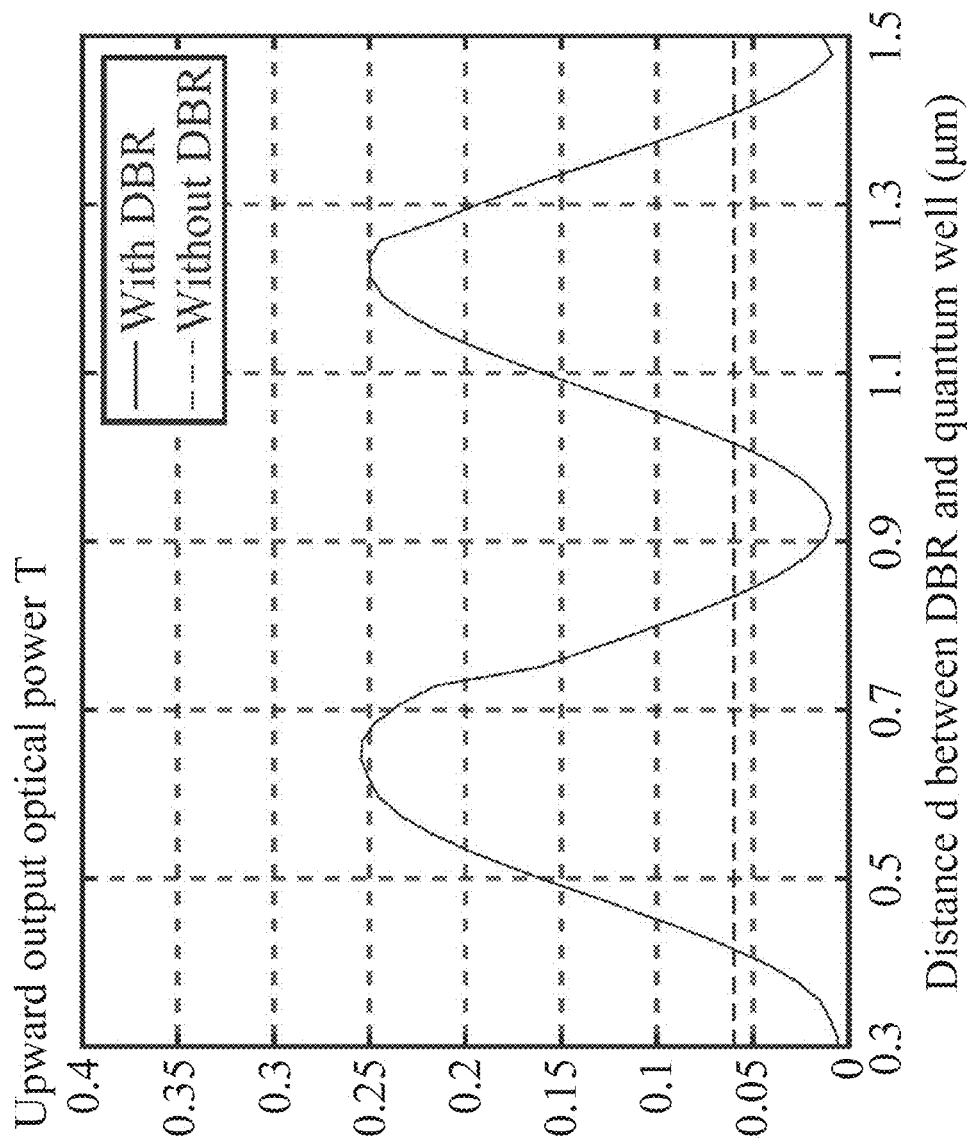
FIG. 27 shows the upward output optical power of a laser versus the distance between the DBR and the quantum well layer with or without a DBR in the first cladding layer.
Figure 28:
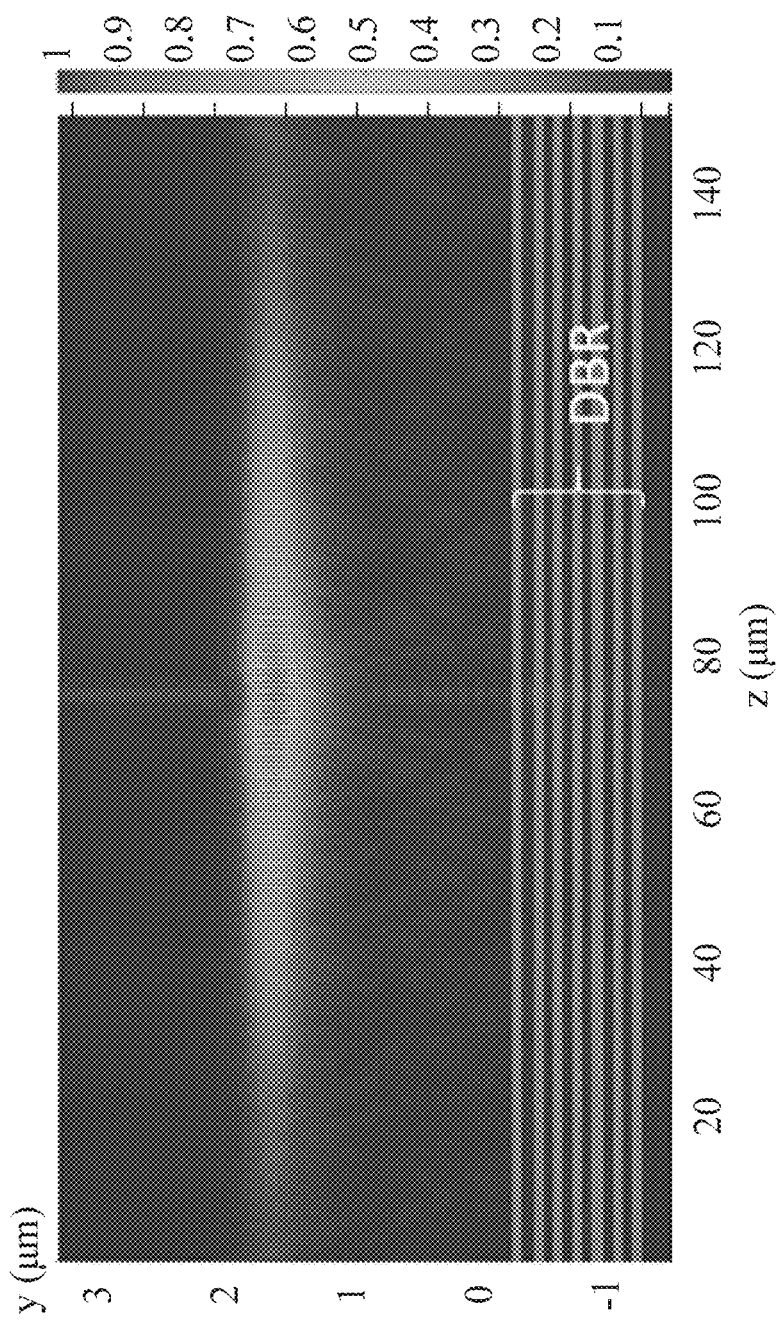
FIG. 28 shows the intensity distribution of the intra-cavity light field when the first cladding layer contains a DBR according to one embodiment of the disclosure.

In addition, in order to increase the upward output optical power, a highly reflective Bragg DBR can be epitaxially grown under the active layer, so that the original downward output light can be reflected and output upward, forming overlapped output light by interference. By adjusting the distance from the Bragg mirror to the grating layer, the phase difference between the two upward output lights can be controlled to control the magnitude of the output optical power. FIG. 27 shows the upward output optical power of the surface-emitting laser of the disclosure as a function of the distance between the DBR and the quantum well. And the upward output optical power without the DBR is also shown in this figure. It can be seen that the optical power varies periodically with the distance between the DBR and the quantum well. When the distance is selected at the maximum output power, the quality factor of the mode is drastically lowered, so that the resonance mode cannot be formed. Therefore, when the distance between the DBR and the quantum well is set to be about 0.4 µm, the output power is about doubled when the DBR is not added, and the quality factor can be maintained at 10,000. FIG. 28 shows an intraluminal light field of a surface emitting laser of the disclosure containing a DBR in a first cladding layer. It can be seen that the DBR reflects part of the light upwards.

In summary, the disclosure discloses a surface emitting laser based on a surface grating. The laser is a ridge waveguide structure, and includes a substrate, a lower waveguide cladding layer, an active layer and an upper waveguide cladding layer from bottom to top; a Bragg grating is etched on the surface of the ridge waveguide; no electrodes are formed on the ridge waveguide, and the electrodes are deposed on both sides of the ridge waveguide; two grooves are etched between the ridge waveguide and the two side electrodes; the first cladding layer of the laser comprises one or more current confinement regions, or a buried tunnel junction is formed in the second cladding layer to limit current flowing. Since the carriers are confined in the mode of the ridge waveguide, the volume of the carrier injection region can be reduced, achieving a low threshold characteristic. The first and second-order surface gratings are etched along the length of the laser cavity to select a specific mode to become the lasing mode, and then the first order diffraction of the second-order grating is used to vertically output the selected mode to achieve surface emitting laser with a single mode and a far-field single peak. The disclosure does not require secondary epitaxial growth of the material, and the manufacturing process is simple, thereby reducing the manufacturing cost of the device and improving the reliability of the device. In addition, the laser of the disclosure relates to a surface-emitting laser, which can realize a single-mode and single-lobed spot output, and has a small emission angle, and can have high coupling efficiency with the optical fiber, and the overall test is simple.

It will be obvious to those skilled in the art that changes and modifications may be made, and therefore, the aim in the appended claims is to cover all such changes and modifications.

What is claimed is:

1. A surface emitting laser, comprising:
a substrate;
two lower electrodes;
a first cladding layer;
an active layer;
a conductive layer;
a second cladding layer;
a ridge waveguide; and
two upper electrodes;
wherein:
the second cladding layer comprises a central region and two side regions; the ridge waveguide is disposed on the central region and the two upper electrodes are disposed on the two side regions, respectively;
the ridge waveguide comprises a plurality of Bragg gratings;
the two upper electrodes are disposed on both sides of the ridge waveguide, respectively; and the two lower electrodes are disposed outside the two upper electrodes, respectively;
the two lower electrodes are disposed on two edges of the first cladding layer, respectively;
two grooves are formed between the ridge waveguide and each of the two upper electrodes, respectively;
the active layer is disposed on the first cladding layer; and the conductive layer is disposed on the active layer;
the ridge waveguide is electrically connected to the two upper electrodes via the conductive layer; and
the first cladding layer or the second cladding layer comprises a resistive region.

2. The laser of claim 1, wherein the plurality of Bragg gratings comprises one second-order grating and two first-order gratings; a period of the Bragg gratings is $\Lambda=m\lambda_B/2n_{eff}$, where $\lambda_B$ and m are a wavelength and an order of the Bragg gratings, respectively; m=1 represents a first-order grating, and m=2 represents a second-order grating; and $n_{eff}$ is an effective refractive index of a waveguide; the one second-order grating is disposed in a central region of a longitudinal direction of the laser, providing $\lambda/4$ phase shift and vertical scattering of light; and the two first-order gratings are disposed on both sides of the one second-order grating, providing optical feedback and wavelength selection.

3. The laser of claim 1, wherein the two grooves extend to the conductive layer, and a width of the two grooves is greater than 500 nanometers.

4. The laser of claim 1, wherein the resistive region is disposed in the first cladding layer close to the active layer or in the second cladding layer close to the active layer.

5. The laser of claim 1, wherein the resistive region comprises a pre-buried high aluminum component layer to form an oxidized layer, or an iron implanted layer, or a reverse biased PN junction.

6. The laser of claim 1, wherein the active layer comprises an active semiconductor layer and one or more confinement layers; and the active semiconductor layer comprises multi-quantum wells, quantum dots or bulk material.

7. The laser of claim 1, wherein the first cladding layer comprises a distributed Bragg reflector (DBR).

8. The laser of claim 2, wherein the layer above the second-order grating comprises a distributed Bragg reflector (DBR) of metal or dielectric.

* * * * *